(12) United States Patent
Wong et al.

(10) Patent No.: US 11,916,356 B2
(45) Date of Patent: Feb. 27, 2024

(54) MODIFIED EMITTER ARRAY

(71) Applicant: Lumentum Operations LLC, San Jose, CA (US)

(72) Inventors: Vincent V. Wong, Los Altos, CA (US); Jay A. Skidmore, San Jose, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 17/662,268

(22) Filed: May 6, 2022

(65) Prior Publication Data

US 2022/0263294 A1    Aug. 18, 2022

Related U.S. Application Data

(62) Division of application No. 16/241,258, filed on Jan. 7, 2019, now abandoned.

(Continued)

(51) Int. Cl.
| | |
|---|---|
| *H01S 5/42* | (2006.01) |
| *H01S 5/042* | (2006.01) |
| *H01S 5/183* | (2006.01) |
| *H01S 5/00* | (2006.01) |
| *H01S 5/028* | (2006.01) |

(Continued)

(52) U.S. Cl.
CPC ............ *H01S 5/423* (2013.01); *H01S 5/0421* (2013.01); *H01S 5/04256* (2019.08); *H01S 5/18361* (2013.01); *H01S 5/0021* (2013.01); *H01S 5/0042* (2013.01); *H01S 5/0282* (2013.01); *H01S 5/04254* (2019.08); *H01S 5/18308* (2013.01); *H01S 5/18311* (2013.01); *H01S 5/18313* (2013.01); *H01S 5/18333* (2013.01); *H01S 5/18341* (2013.01); *H01S 5/18369* (2013.01); *H01S 5/187* (2013.01);
(Continued)

(58) Field of Classification Search
CPC ... H01S 5/42; H01S 5/423; H01S 5/18–18397
See application file for complete search history.

(56) References Cited

U.S. PATENT DOCUMENTS

| | | |
|---|---|---|
| 7,643,524 B2 | 1/2010 | Mizuuchi et al. |
| 9,742,153 B1 | 8/2017 | Barve et al. |

(Continued)

FOREIGN PATENT DOCUMENTS

| | | |
|---|---|---|
| CA | 2441090 A1 | 11/2002 |
| JP | 2005116933 A | 4/2005 |

(Continued)

*Primary Examiner* — Xinning(Tom) Niu
*Assistant Examiner* — Delma R Fordé
(74) *Attorney, Agent, or Firm* — Harrity & Harrity, LLP

(57) ABSTRACT

An emitter array, may comprise a first set of emitters that has a nominal optical output power at an operating voltage. The emitter array may comprise a second set of emitters that has substantially less than the nominal optical output power or no optical output power at the operating voltage. The first set of emitters and the second set of emitters may be interleaved with each other to form a two-dimensional regular pattern of emitters that emits a random pattern of light at the nominal optical output power at the operating voltage. The first set of emitters and the second set of emitters may be electrically connected in parallel.

20 Claims, 37 Drawing Sheets

Related U.S. Application Data

(60) Provisional application No. 62/622,465, filed on Jan. 26, 2018, provisional application No. 62/681,573, filed on Jun. 6, 2018.

(51) Int. Cl.
  *H01S 5/187* (2006.01)
  *H01S 5/20* (2006.01)
  *H01S 5/343* (2006.01)

(52) U.S. Cl.
  CPC .............. *H01S 5/2063* (2013.01); *H01S 5/343* (2013.01); *H01S 2301/176* (2013.01)

(56) References Cited

U.S. PATENT DOCUMENTS

| | | | |
|---|---|---|---|
| 10,153,614 | B1 | 12/2018 | Lin et al. |
| 11,196,230 | B2 * | 12/2021 | Barve ................. H01S 5/18369 |
| 2002/0114369 | A1 * | 8/2002 | Kinoshita ............. H01S 5/1071 372/96 |
| 2005/0078726 | A1 | 4/2005 | Watanabe et al. |
| 2010/0303113 | A1 | 12/2010 | Joseph |
| 2016/0072258 | A1 | 3/2016 | Seurin et al. |
| 2016/0164261 | A1 | 6/2016 | Warren |
| 2017/0353012 | A1 | 12/2017 | Barve et al. |
| 2019/0237940 | A1 | 8/2019 | Wong et al. |

FOREIGN PATENT DOCUMENTS

| | | |
|---|---|---|
| JP | 2009146941 A | 7/2009 |
| JP | 2011003748 A | 1/2011 |
| JP | 2012028412 A | 2/2012 |

* cited by examiner

| | A | B | C | D |
|---|---|---|---|---|
| | Concept | Output Power | Low Current at Standard Vop | Electrical Power Draw |
| 1 | Non-Degraded Emitter | 100% | | 100% |
| 2 | Current Blocking Implant (i.e. Proton) - Full Emitter | 0% | | 0% |
| 3 | Current Blocking Implant (i.e. Proton) - Emitter Perimeter | <20% | | <20% |
| 4 | Current Blocking Implant (i.e. Proton) - Emitter Center | <5% | | <20% |
| 5 | Current Blocking Implant (i.e. Proton) - Under P-Contact | <5% | YES | <20% |
| 6 | High Doped Lossy Implant (i.e. Beryllium) | <5% | | ~100% |
| 7 | High Doped Implant for p-n-p current blocking (i.e. Silicon) | 0% | YES | 0% |

FIG. 4A

| | A | B | C | D |
|---|---|---|---|---|
| 9 | Damaging Implant for higher resistance in P-DBR | <5% | YES | <20% |
| 10 | Etch Semiconductor (out of phase, poor contact resistance) | <5% | YES | <5% |
| 11 | Change SiN Thickness for Low R%, High Ith | <5% | | ~100% |
| 12 | Narrow OA Diameter (move trenches = small emitter) | <20% | | <20% |
| 13 | Reduce Metal Contact Area (increase electrical resistance) | <20% | YES | <20% |
| 14 | Reduce Metal Contact Via (increase electrical resistance) | <20% | YES | <20% |
| 15 | Block Light with Metal (pull in contact metal) | <20% | | ~100% |

| | A | E | F | G | H |
|---|---|---|---|---|---|
| | Concept | Optical Looks like standard emitter | New Process | Risks and tradeoffs | Comments |
| 1 | Standard Emitter | YES | --- | --- | |
| 2 | Current Blocking Implant (i.e. Proton) - Full Emitter | YES | No, only Mask Change | No Power | Include on mask |
| 3 | Current Blocking Implant (i.e. Proton) - Emitter Perimeter | YES | No, only Mask Change | Eye Safety, Draws Current | |
| 4 | Current Blocking Implant (i.e. Proton) - Emitter Center | YES | No, only Mask Change | Draws Current | |
| 5 | Current Blocking Implant (i.e. Proton) - Under P-Contact | YES | No, only Mask Change | Draws Current | Possible, can include on first mask |
| 6 | High Doped Lossy Implant (i.e. Beryllium) | YES | YES | Draws >>100% Current | |
| 7 | High Doped Implant for p-p current blocking (i.e. Silicon) | YES | YES | No Power, Hard to Control? | |

FIG. 4C

| | A | E | F | G | H |
|---|---|---|---|---|---|
| 9 | Damaging Implant for higher resistance in P-DBR | YES | YES | Hard to Control? | |
| 10 | Etch Semiconductor (out of phase, poor contact resistance) | YES (from top) | YES | Draws Current, looks different in FIB/SEM | Best Performance, need process dev |
| 11 | Change SiN Thickness for Low R%, High ith | YES (from top) | YES | Draws Current, looks different in FIB/SEM, hard to control? | |
| 12 | Narrow OA Diameter (more trenches = small emitter) | No | No, only Mask Change | Eye Safety, Draws Current | |
| 13 | Reduce Metal Contact Area (increase electrical resistance) | Slightly Different | No, only Mask Change | Draws Current, looks different in FIB/SEM, hard to control? | Best Schedule and expect ok |
| 14 | Reduce Metal Contact Via (increase electrical resistance) | Slightly Different | No, only Mask Change | Draws Current, looks different in FIB/SEM, hard to control? | Best Schedule and expect ok |
| 15 | Block Light with Metal (pull in contact metal) | No | No, only Mask Change | Draws >=100% Current, looks different, hard to control? | |

FIG. 4D

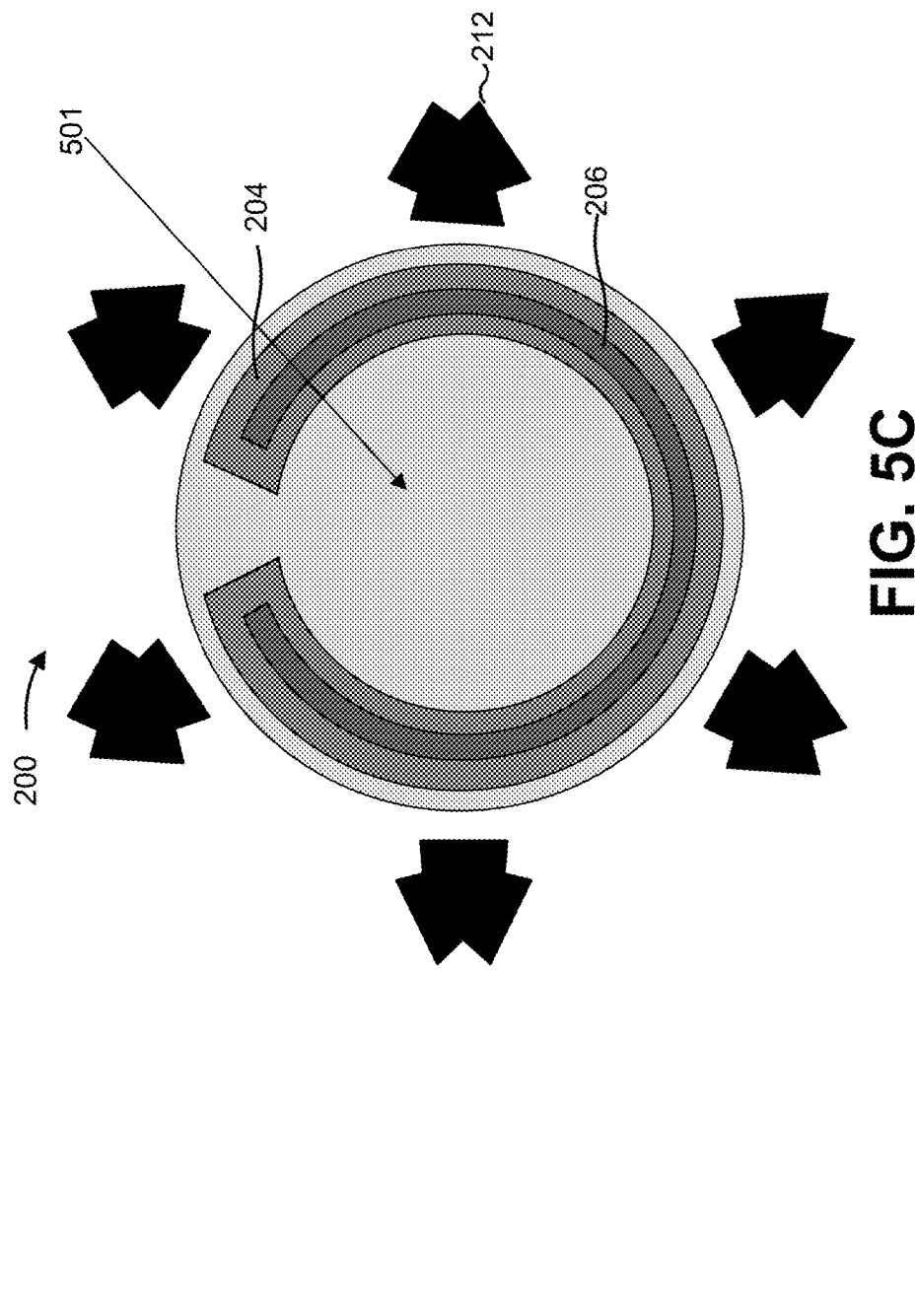

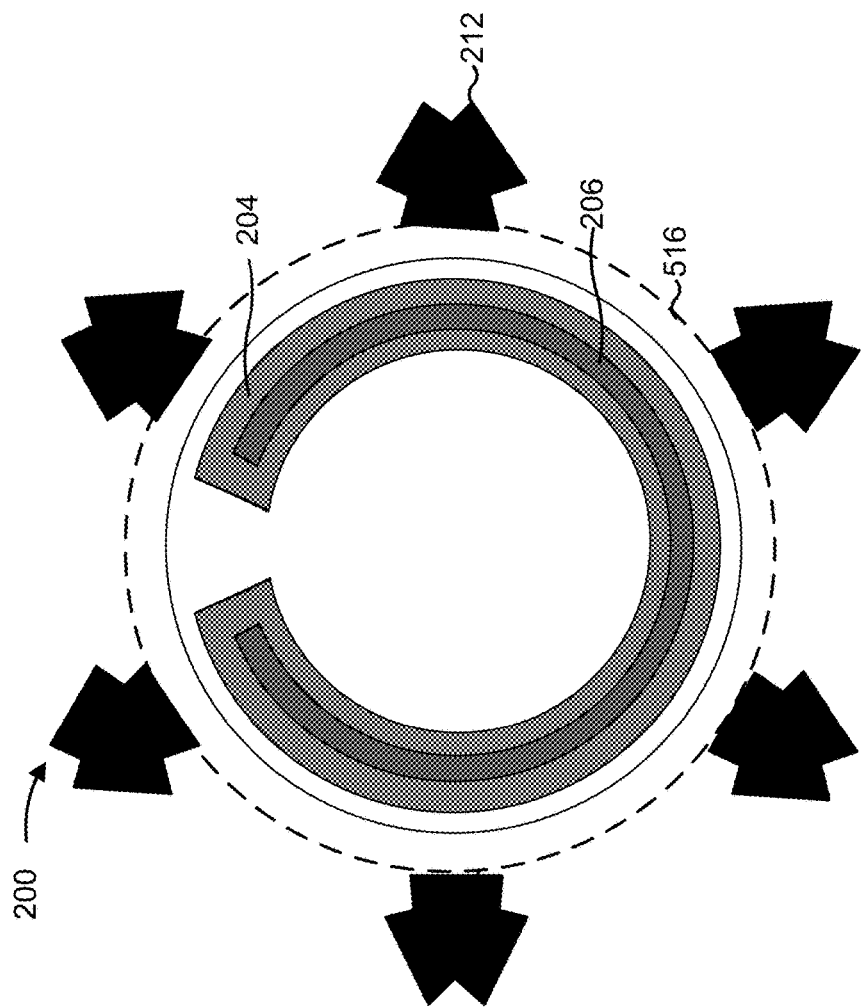

MODIFIED EMITTER ARRAY

RELATED APPLICATIONS

This application is a divisional of U.S. patent application Ser. No. 16/241,258, filed Jan. 7, 2019, which claims priority under 35 U.S.C. § 119 to U.S. Provisional Patent Application No. 62/622,465, filed on Jan. 26, 2018, and to U.S. Provisional Patent Application No. 62/681,573, filed on Jun. 6, 2018, the contents of each of which are incorporated by reference herein in their entirety.

TECHNICAL FIELD

The present disclosure relates to an emitter array and, more particularly, to a modified emitter array for modified optical output power.

BACKGROUND

A vertical emitter, such as a vertical cavity surface emitting laser (VCSEL), is a laser in which a beam is emitted in a direction perpendicular to a surface of a substrate (e.g., vertically from a surface of a semiconductor wafer). Multiple vertical emitters may be arranged in an array with a common substrate.

SUMMARY

According to some possible implementations, a vertical cavity surface emitting laser (VCSEL) array may comprise: a first set of VCSELs; and a second set of VCSELs, wherein the first set of VCSELs and the second set of VCSELs are interleaved with each other to form a two-dimensional regular pattern of VCSELs, wherein the first set of VCSELs and the second set of VCSELs are electrically connected in parallel, wherein the second set of VCSELs forms a random pattern of VCSELs within the two-dimensional regular pattern of VCSELs, wherein each VCSEL of the first set of VCSELs has a nominal optical output power at an operating voltage of the VCSEL array, and wherein each VCSEL of the second set of VCSELs has substantially less than the nominal optical output power or no optical output power at the operating voltage.

According to some possible implementations, a method of forming a vertical cavity surface emitting laser (VCSEL) array may comprise: forming a plurality of VCSELs on or within a substrate, wherein forming the plurality of VCSELs includes forming a first set of VCSELs and a second set of VCSELs that are randomly interleaved with the first set of VCSELs and that form a two-dimensional regular pattern of VCSELs that are electrically connected in parallel; and degrading a performance of the second set of VCSELs, of the plurality of VCSELs, without degrading the performance of the first set of VCSELs of the plurality of VCSELs, wherein degrading the performance of the second set of VCSELs includes degrading the performance of the second set of VCSELs such that the second set of VCSELs has substantially less optical output power than a nominal optical output power of the first set of VCSELs or has no optical output power.

According to some possible implementations, an emitter array may comprise: a first set of emitters that has a nominal optical output power at an operating voltage; and a second set of emitters that has substantially less than the nominal optical output power or no optical output power at the operating voltage, wherein the first set of emitters and the second set of emitters are interleaved with each other to form a two-dimensional regular pattern of emitters that emits a random pattern of light at the nominal optical output power at the operating voltage, wherein the first set of emitters and the second set of emitters are electrically connected in parallel.

According to some possible implementations, a method may include generating (or forming) an array of light spots for three-dimensional sensing with a first set of emitters and a second set of emitters. The second set of emitters may be randomly interleaved with the first set of emitters. The second set of emitters may have less optical power than the first set of emitters.

According to some possible implementations, a method may include generating (or forming), a light pattern for three-dimensional sensing, wherein the light pattern comprises a first set of light spots and a second set of light spots. The second set of light spots may be randomly interleaved with the first set of light spots. The second set of light spots may have less optical power than the first set of light spots.

BRIEF DESCRIPTION OF THE DRAWINGS

FIGS. 4A-4D are charts of example features of various designs of emitters described herein.

DETAILED DESCRIPTION

The following detailed description of example implementations refers to the accompanying drawings. The same reference numbers in different drawings may identify the same or similar elements.

In different contexts, different illumination patterns of emitters may be needed. For example, in a structured light context, using an emitter array that includes a random configuration of emitters that output a random pattern of optical output may provide more accurate results relative to using an emitter array that outputs a uniform pattern of optical output. While a random pattern of optical output can be obtained by manufacturing an emitter array with a random configuration of emitters, this can be expensive and/or inefficient as a manufacturing processes may need to be significantly reconfigured for different random configurations of emitters.

Some implementations described herein provide an emitter array that includes a regular pattern of emitters where some of the emitters have been modified to cause the emitter array to output a random pattern of optical output. In this way, some implementations described herein provide a random pattern of optical output without needing an emitter array with a random configuration of emitters. This reduces or eliminates a need to manufacture different emitter arrays with different random configurations of emitters, thereby conserving costs associated with and/or improving an efficiency of manufacturing different emitter arrays with different random patterns of optical output. In addition, this simplifies a process for manufacturing an emitter array that is configured to output a random pattern of optical output, thereby conserving time and/or costs associated with manufacturing an emitter array that is capable of outputting a random pattern of optical output. Further, this facilitates use of an emitter array that is configured with a regular pattern of emitters in new and different contexts than would otherwise be possible, thereby improving a use of an emitter that is configured with a regular pattern of emitters.

Figure 1:
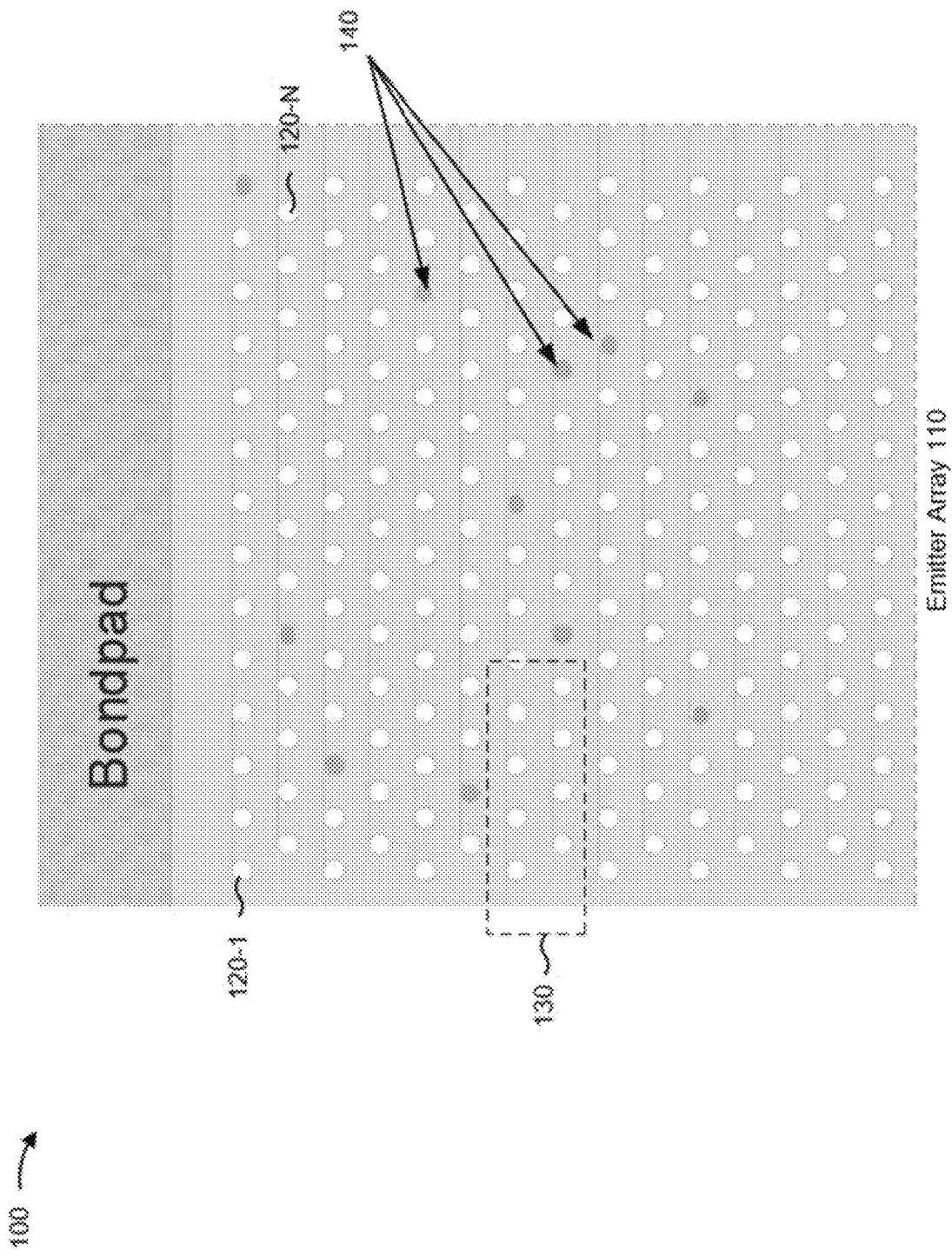
FIG. 1 is a diagram of an example implementation described herein.

FIG. 1 is a diagram of an example implementation 100 described herein. FIG. 1 shows a top view of an emitter array 110. As shown in FIG. 1, emitter array 110 includes various emitters 120-1 through 120-N (e.g., shown as white and gray dots with respect to emitter array 110). In some implementations, emitter 120 may include a light-emitting diode (LED), a vertical cavity surface emitting laser (VCSEL), a vertical external cavity surface emitting laser (VECSEL), a laser, a light-emitting device, and/or the like. In some implementations, the white emitters 120 may be a first set of emitters 120 of emitter array 110. For example, the white emitters 120 may have a nominal optical output power at an operating voltage (e.g., may be a set of non-degraded emitters 120). In some implementations, the gray emitters 120 may be a second set of emitters 120 of emitter array 110. For example, the gray emitters 120 may have substantially less than the nominal optical output power at the operating voltage (e.g., may be a set of degraded emitters 120). Continuing with the previous example, the degraded emitters 120 that have substantially less than the nominal optical output power may have an optical output power that is at least 50 percent less than that of the non-degraded emitters 120 at the operating voltage. In some implementations, the degraded emitters 120 may have no optical output power at the operating voltage. For example, the degraded emitters 120 may not lase at the operating voltage.

In some implementations, the first set of emitters 120 (e.g., the non-degraded emitters 120) and the second set of emitters 120 (e.g., the degraded emitters 120) may be interleaved with each other. For example, a row and/or column of emitters 120 included in emitter array 110 may include emitters 120 from both the first set of emitters 120 and the second set of emitters 120 (e.g., may include both non-degraded emitters 120 and degraded emitters 120). As shown by reference number 130, emitters 120 of emitter array 110 may be arranged in two-dimensional regular pattern. For example, emitters 120 may arranged into a row and column pattern of emitters 120, a repeating pattern of emitters in a particular shape, and/or the like. As shown by reference number 140, the second set of emitters 120 may form a random pattern of emitters 120 within the two-dimensional pattern of emitters 120. For example, the second set of emitters 120 may be arranged into a random pattern within the two-dimensional pattern of emitters 120. By having degraded emitters 120 (e.g., the second set of emitters 120) arranged into a random pattern within emitter array 110, the pattern of non-degraded emitters 120 (e.g., the first set of emitters 120) may cause emitter array 110 to output a random non-uniform pattern of optical output at an operating voltage when lasing.

In this way, emitter array 110 that includes a regular two-dimensional pattern of emitters 120 may output a random pattern of light at an operating voltage (Vop). This reduces or eliminates a need to manufacture emitter array 110 with a random pattern of emitters 120, thereby conserving time and/or cost associated with manufacturing an emitter array 110 that outputs a random pattern of light. In addition, this facilitates adaptation of an existing manufacturing process, rather than re-tooling of the manufacturing process, to produce emitter array 110 that outputs a random pattern of light, thereby conserving time and/or costs. Further, this facilitates use of emitter array 110 with a regular two-dimensional pattern of emitters 120 in new contexts, such as structured light contexts, thereby improving a use of emitter array 110.

As indicated above, FIG. 1 is provided merely as an example. Other examples are possible and may differ from what was described with regard to FIG. 1. The number and arrangement of components of emitter array 110 shown in FIG. 1 are provided as an example. In practice, emitter array 110 may include additional components, fewer components, different components, or differently arranged components than those shown in FIG. 1.

Figure 2A:
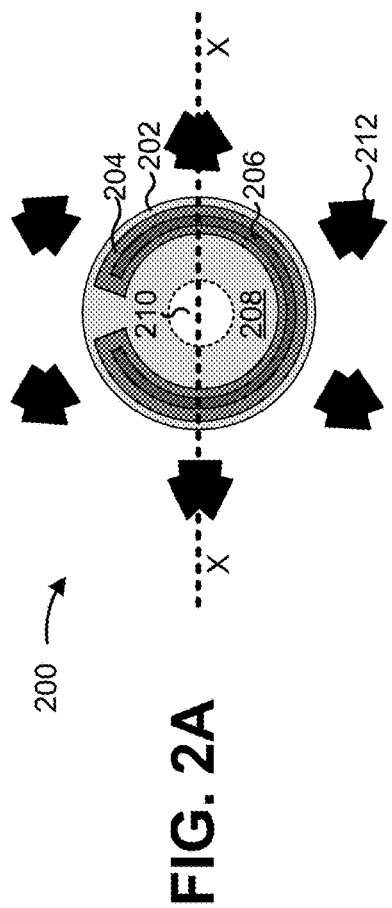
FIGS. 2A and 2B are diagrams depicting a top-view of an example vertical-emitting device and a cross-sectional view of the example vertical-emitting device, respectively.
Figure 2B:
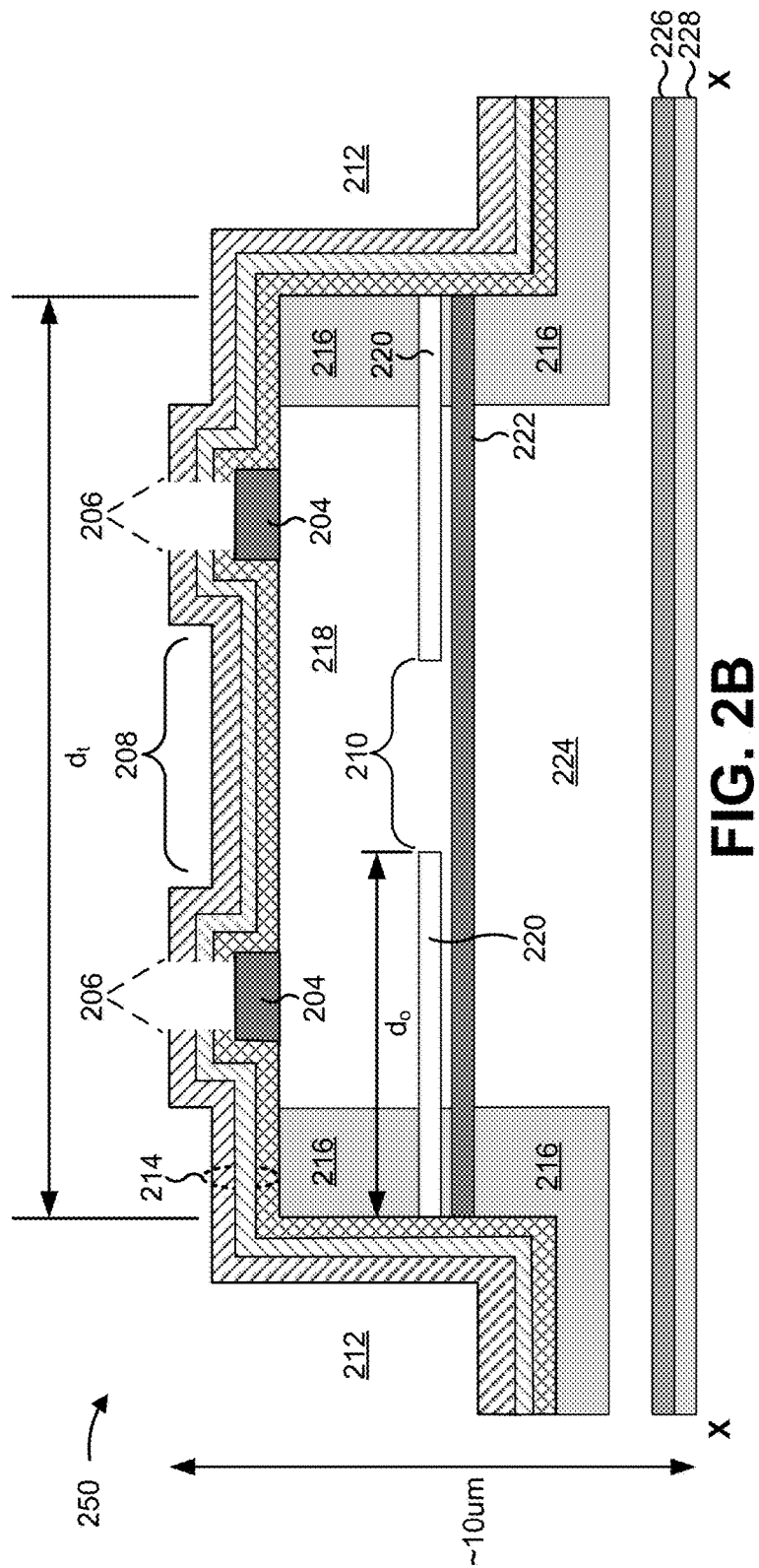

FIGS. 2A and 2B are diagrams depicting a top-view of an example emitter 200 and a cross-sectional view 250 of example emitter 200, respectively. As shown in FIG. 2A, emitter 200 may include a set of emitter layers constructed in an emitter architecture. In some implementations, emitter 200 may correspond to one or more vertical-emitting devices described herein.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric via opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 μm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 μm to approximately 14.0 μm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as $d_o$ in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Figure 3:
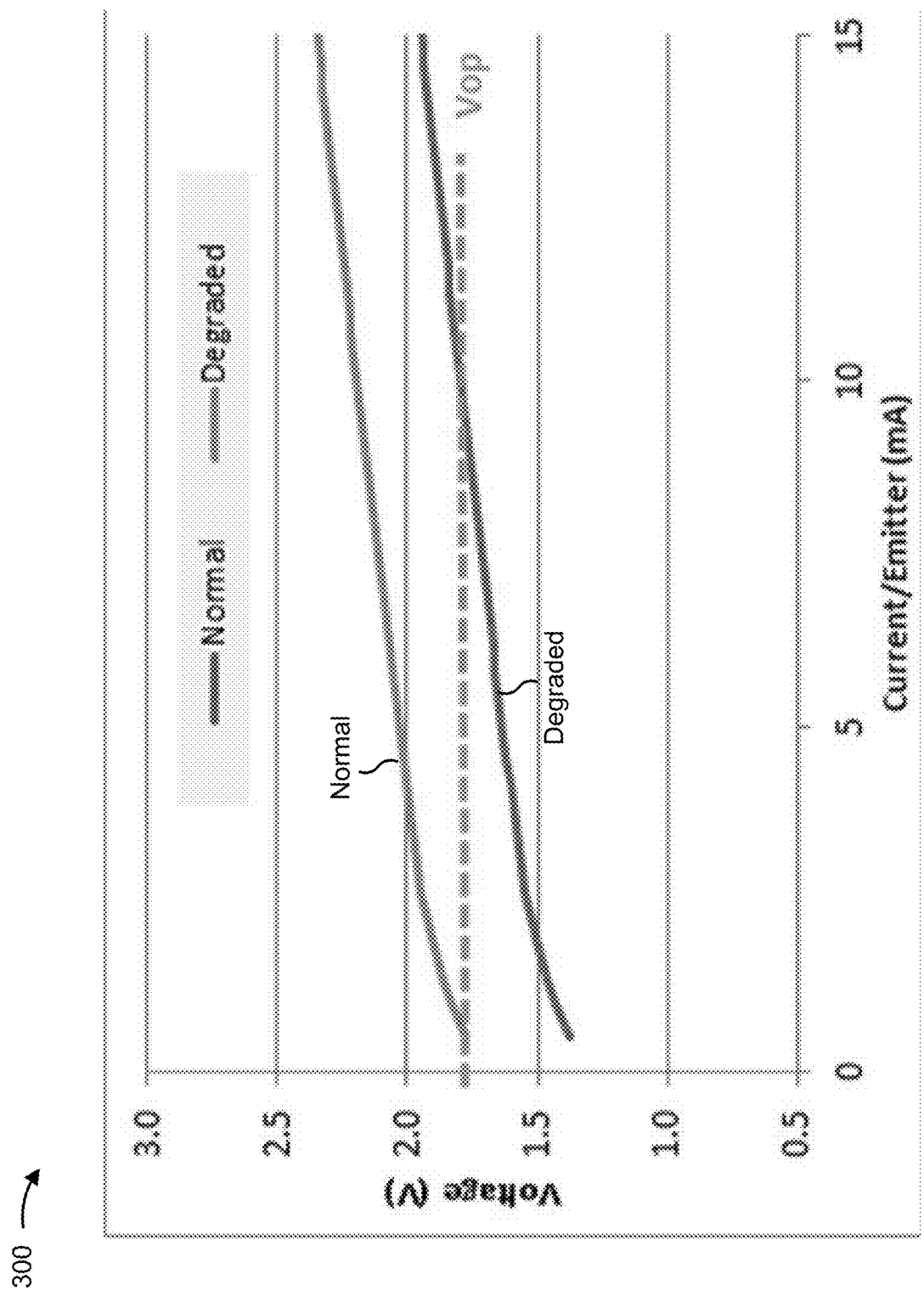
FIG. 3 is a diagram of an example voltage versus current per emitter plot for potential degraded emitters described herein.

FIG. 3 is a diagram 300 of an example voltage versus current per emitter plot for potential degraded emitters described herein. For example, FIG. 3 shows an example voltage versus current per emitter 120 ("current/emitter") plot for potential degraded emitters 120.

In some implementations, at an operating voltage (Vop), the degraded emitters 120 may consume minimal current. In some implementations, the curve for degraded emitters 120 may be offset in voltage by a minimum increased voltage, such as at least an additional 0.3V or 0.5V to draw the same current as a non-degraded emitter 120 (shown as "normal" in the plot). In some implementations, the voltage increase for degraded emitters 120 may not track the non-degraded emitters 120 as closely as illustrated. For example, as voltage increases, the gap between non-degraded emitter 120 and degraded emitter 120 current consumption may increase further.

As indicated above, FIG. 3 is provided merely as an example. Other examples are possible and may differ from what was described with regard to FIG. 3.

FIGS. 4A-4D are charts 400 of example features of various designs of emitters described herein. FIGS. 4A-4D show a table related to various example implementations to reduce emitter 120 intensity (e.g., to degrade a performance of emitter 120). For example, FIGS. 4A-4D show characteristics of 13 degraded emitter 120 designs compared against each other and against a non-degraded emitter 120 design. As shown in FIGS. 4A and 4B, column A includes information that identifies various implementations related to different designs, concepts, and/or the like of an emitter 120. Column B includes information that identifies a qualitative measure of power output of a degraded emitter 120 normalized to a non-degraded emitter 120. Column C includes information that identifies particular designs that exhibit low current draw at Vop for a degraded emitter 120. Column D includes information that identifies a qualitative measure of electrical power draw of a degraded emitter 120 normalized to a non-degraded emitter 120.

As shown in FIGS. 4C and 4D, Column E includes information that indicates whether a degraded emitter 120 with a particular design has a particular appearance that is physically the same as a non-degraded emitter 120 (e.g., when viewed with an optical microscope). Column F includes information that indicates whether a new manufacturing process development is needed or if a current emitter 120 process can be used to produce the degraded emitter 120 for the particular design. Column G includes information that indicates risks and tradeoffs of the particular designs of degraded emitters 120. Column H includes information that indicates schedule and performance impact for customer response for the particular designs of degraded emitter 120.

As indicated above, FIGS. 4A-4D are provided merely as an example. Other examples are possible and may differ from what was described with regard to FIGS. 4A-4D.

Figure 5A:
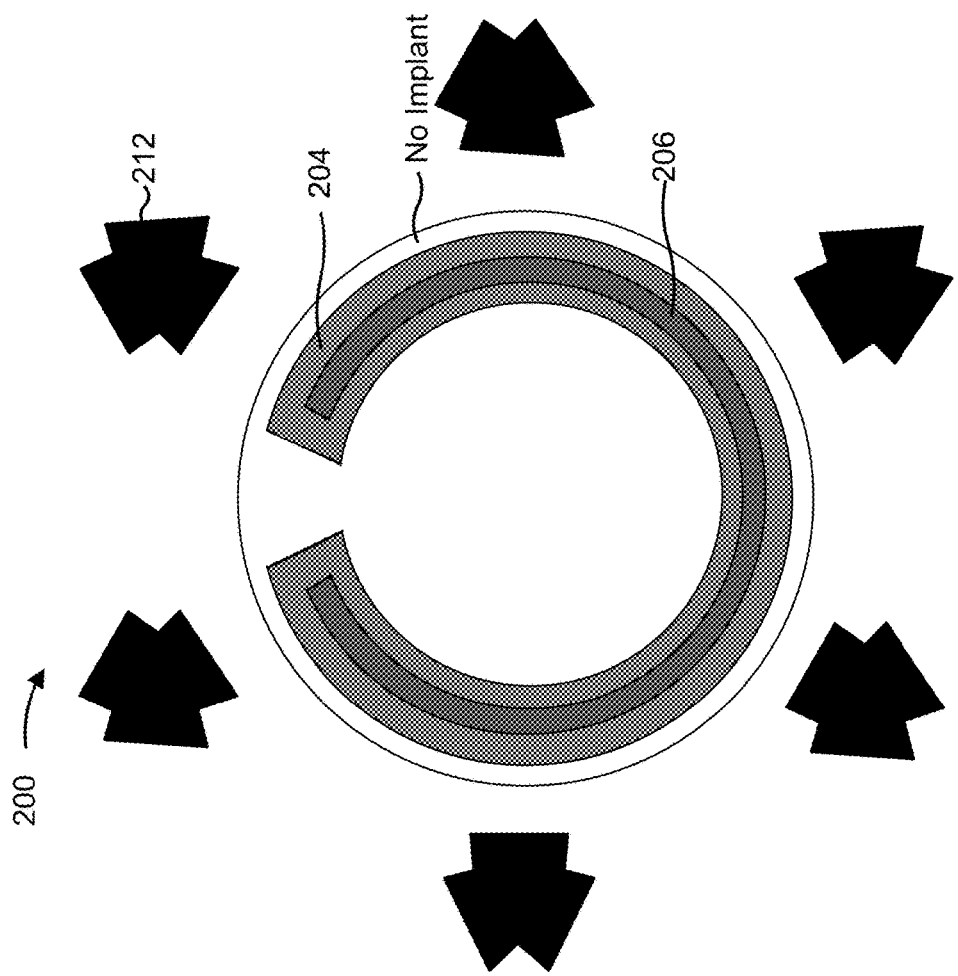
FIGS. 5A-5BB are diagrams depicting various example implementations related to a modified emitter for a modified optical output power.
Figure 5B:
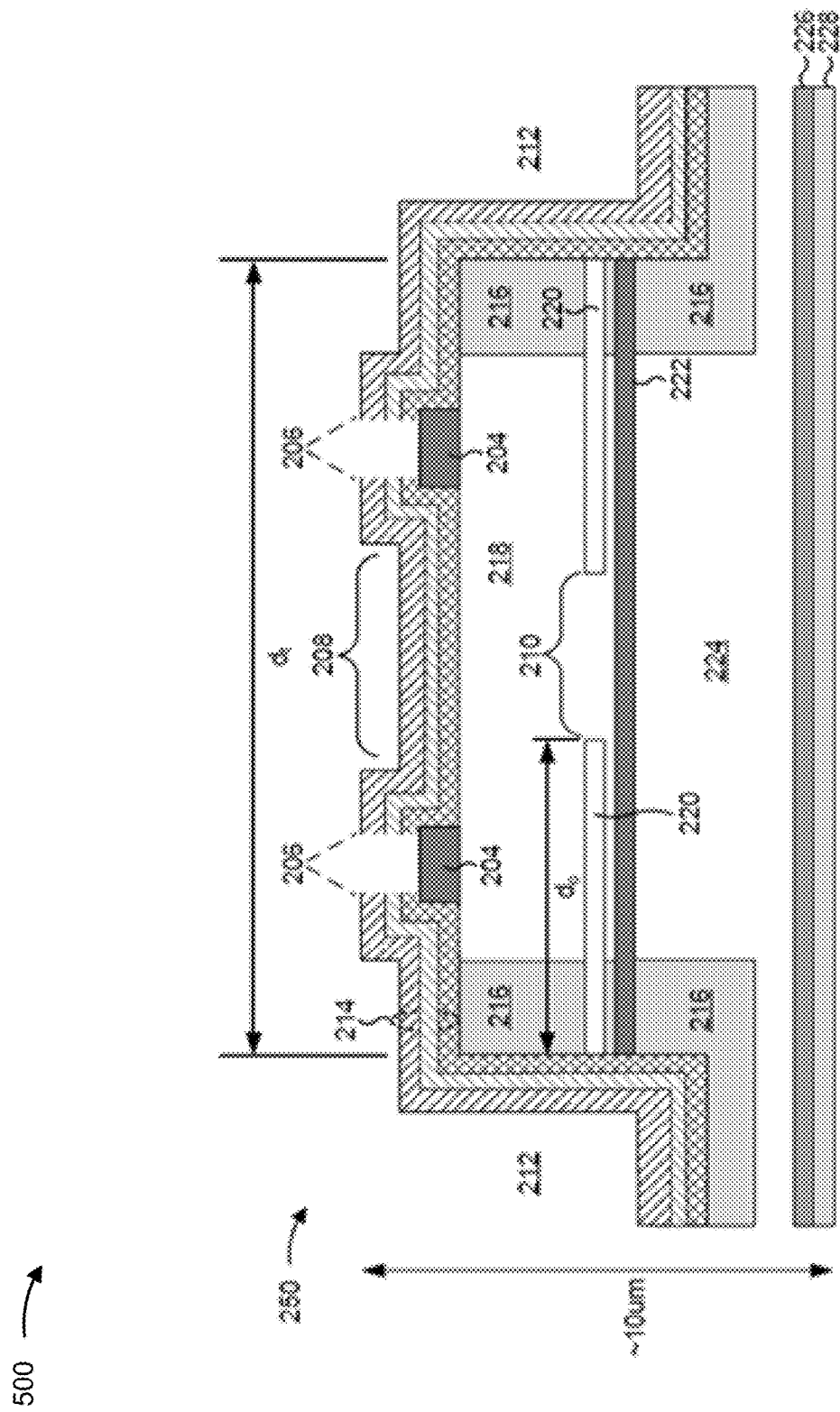

FIGS. 5A-5BB are diagrams depicting various implementations 500 related to a modified vertical-emitting device for a modified optical output. For example, FIGS. 5A-5BB show example designs of a degraded emitter 200 compared to a non-degraded emitter 200.

FIG. 5A shows a top-view of a non-degraded emitter 200, similar to that described with regard to FIGS. 2A and 2B. Similar to that described elsewhere herein, the non-degraded emitter 200 may have a nominal optical output power at Vop. As shown in FIG. 5A, the non-degraded emitter 200 may include various components, such as a trench (e.g., oxidation trench 212), a no implant area (shown by the white area) (e.g., a top mirror 218 and/or a bottom mirror 224), a P-Ohmic contact (e.g., P-Ohmic metal layer 204), and a P-via (e.g., dielectric via opening 206). FIG. 5B shows a cross-sectional view 250 of a non-degraded emitter 200, similar to that described with regard to FIGS. 2A and 2B. Other designs of degraded emitters 200 are described below and shown in the corresponding figures in the context of modifications to the top-view shown in FIG. 5A, and the cross-sectional view 250 shown in FIG. 5B.

Figure 5D:
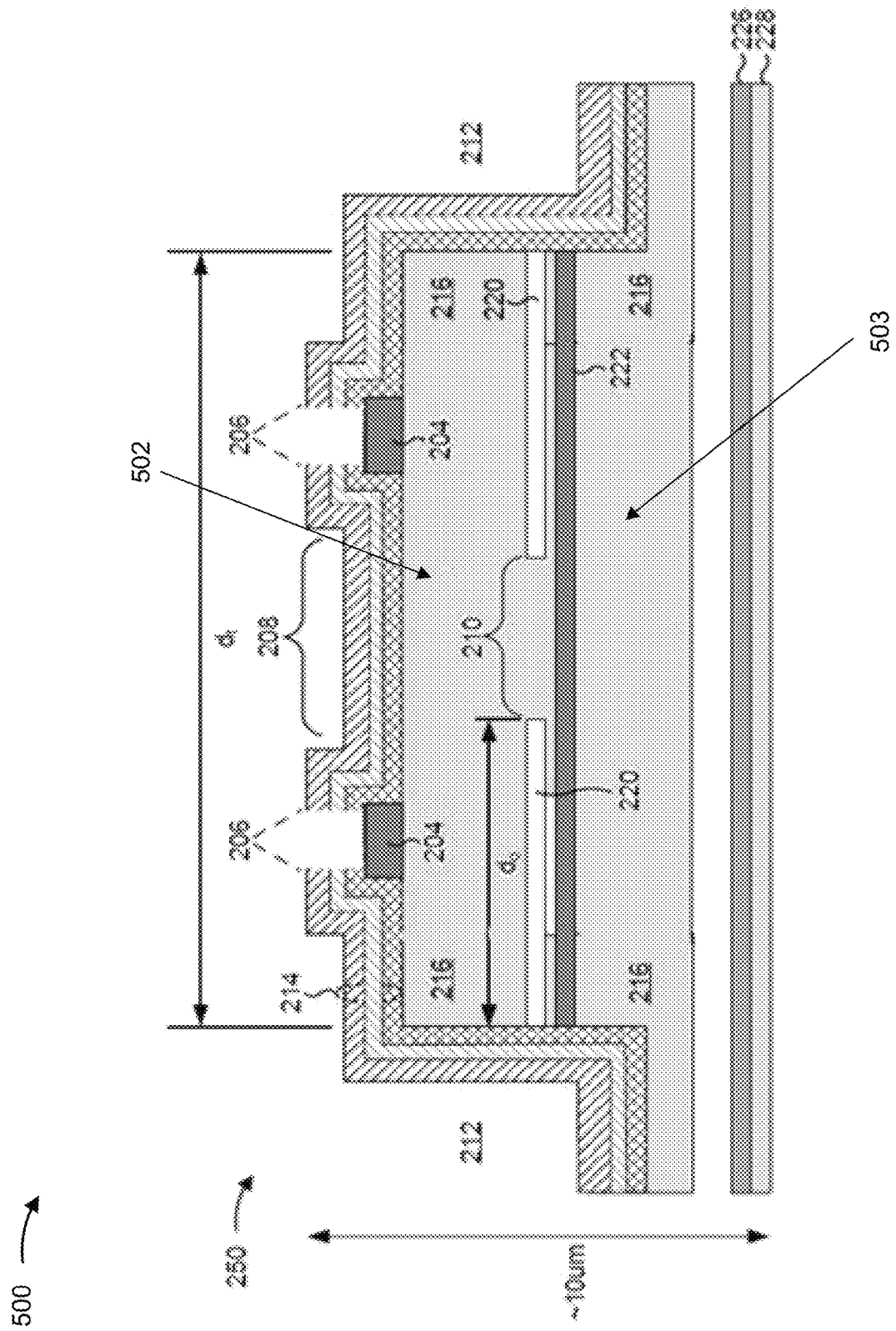

FIG. 5C shows a top-view of a degraded emitter 200 that includes a full emitter current blocking implant. For example, reference number 501 shows that the no implant area of the non-degraded emitter 200 includes a current blocking implant (e.g., implant isolation material 216) in the degraded emitter 200 (shown as the light gray area). FIG. 5D shows a cross-sectional view 250 of the degraded emitter 200 that includes the full emitter current blocking implant. As shown by reference numbers 502 and 503, the full emitter current blocking implant may replace top mirror 218 and/or bottom mirror 224 in the non-degraded emitter 200.

In some implementations, the full emitter current blocking implant may include a proton implant and/or another similar type of implant. In some implementations, the full emitter current blocking implant may cause the degraded emitter 200 to have little or no optical output power at Vop. In some implementations, the degraded emitter 200 may not draw any electrical power at Vop based on the full emitter current blocking implant. In this way, the current blocking implant prevents the degraded emitter 200 from having a nominal optical output power at Vop.

Figure 5E:
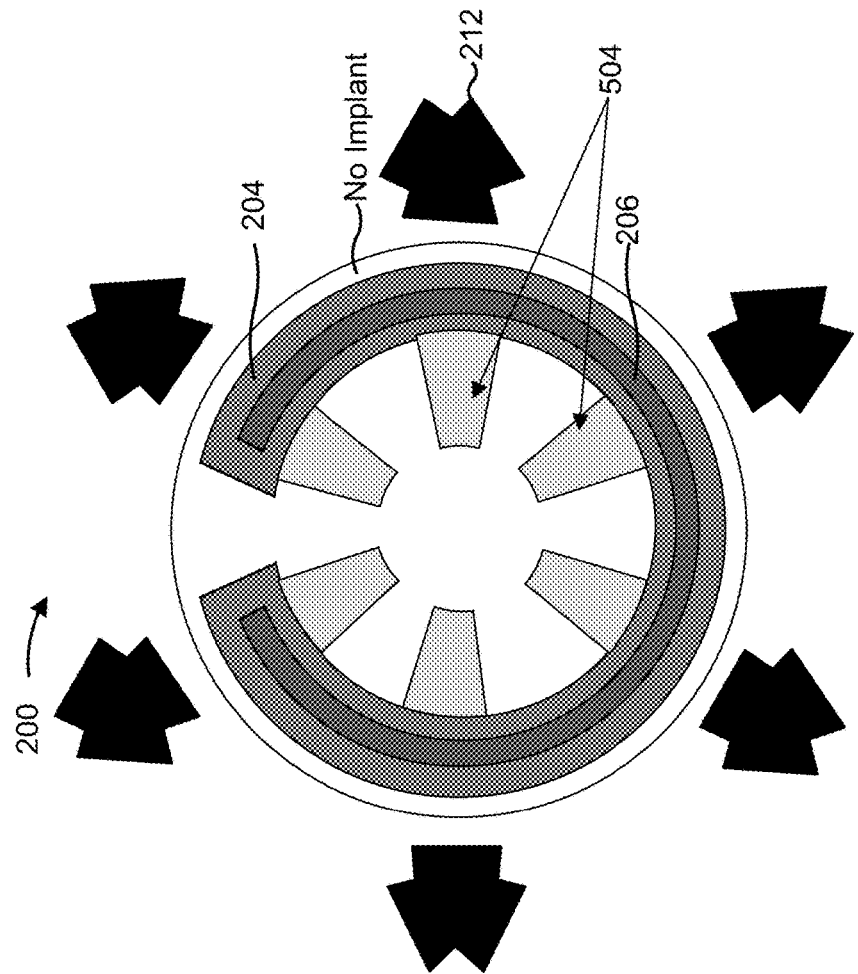
Figure 5F:
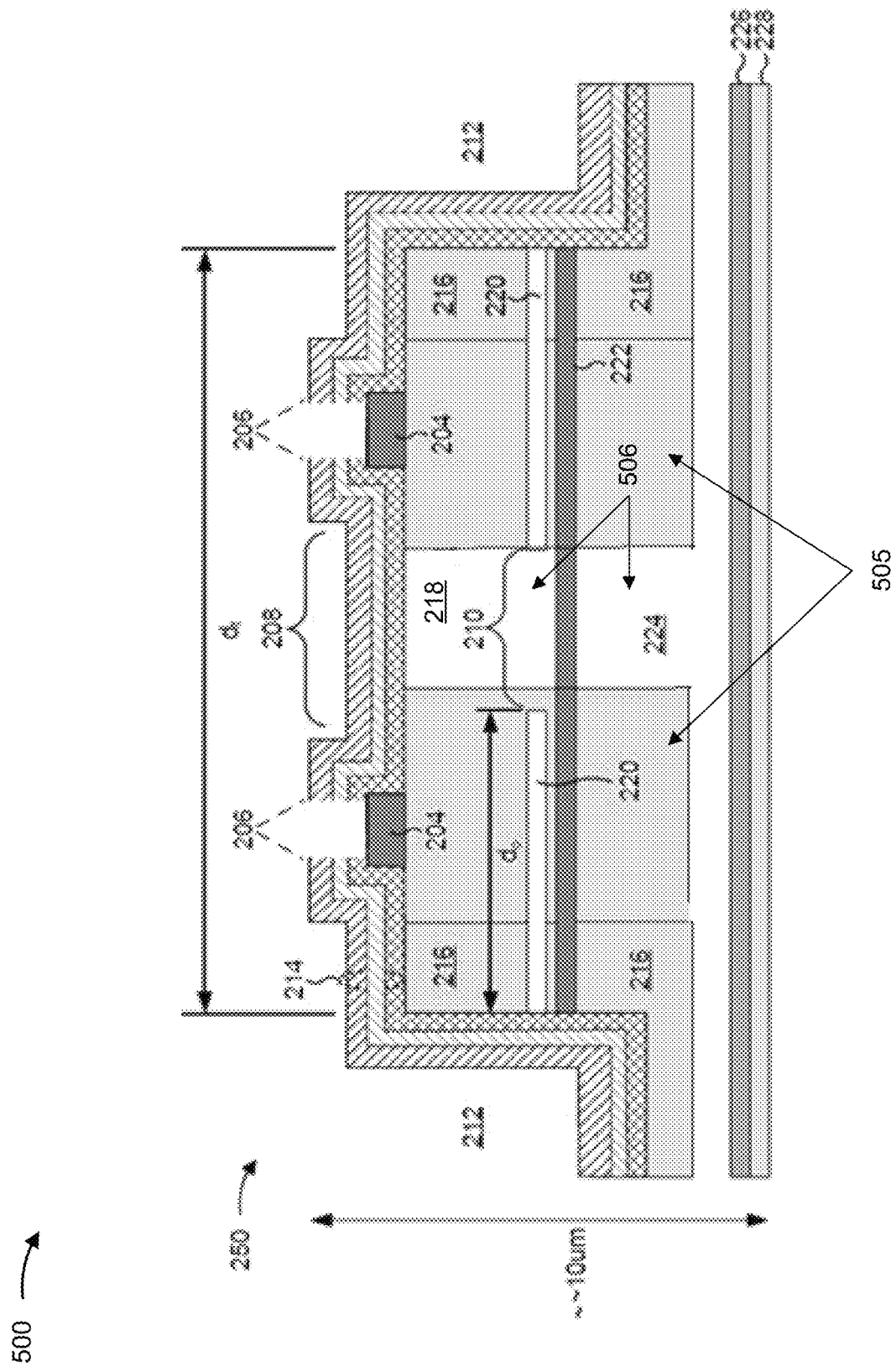

FIG. 5E shows a top-view of a degraded emitter 200 that includes an emitter perimeter current blocking implant. For example, reference number 504 shows that the degraded emitter 200 includes an emitter perimeter current blocking implant (show by the light gray areas) (e.g., implant isolation material 216). As further shown in FIG. 5E, despite including the various emitter perimeter current blocking implants, some of the no implant area that was present in the non-degraded emitter 200 is present in the degraded emitter 200 described with respect to FIG. 5E (shown by the white area). FIG. 5F shows a cross-sectional view 250 the degraded emitter 200 that includes the emitter perimeter current blocking implant. As shown by reference number 505, the degraded emitter 200 includes the emitter perimeter current blocking implant in portions of what would normally be top mirror 218 and bottom mirror 224 of the non-degraded emitter 200. For example, and as shown by reference number 506, the emitter perimeter current blocking implant may cause the degraded emitter 200 to have smaller sized top mirror 218 and bottom mirror 224 relative to the non-degraded emitter 200 (e.g., assuming a similar mesa size between the non-degraded emitter 200 and the degraded emitter 200). In some implementations, the emitter perimeter current blocking implant may include a single implant. Conversely, the emitter perimeter current blocking implant may include multiple implants.

In some implementations, the emitter perimeter current blocking implant may include a proton implant and/or another similar type of implant. In some implementations, the emitter perimeter current blocking implant may cause the degraded emitter 200 to have a reduced optical output power at Vop. For example, the emitter perimeter current blocking implant may cause the degraded emitter 200 to have less than approximately 20 percent of the optical output power of the non-degraded emitter 200 at Vop. In some implementations, the emitter perimeter current blocking implant may cause the degraded emitter 200 to have less electrical power draw than the non-degraded emitter 200.

For example, the emitter perimeter current blocking implant may cause the degraded emitter 200 to draw less than approximately 20 percent of the electrical power as the non-degraded emitter 200 at Vop.

Figure 5G:
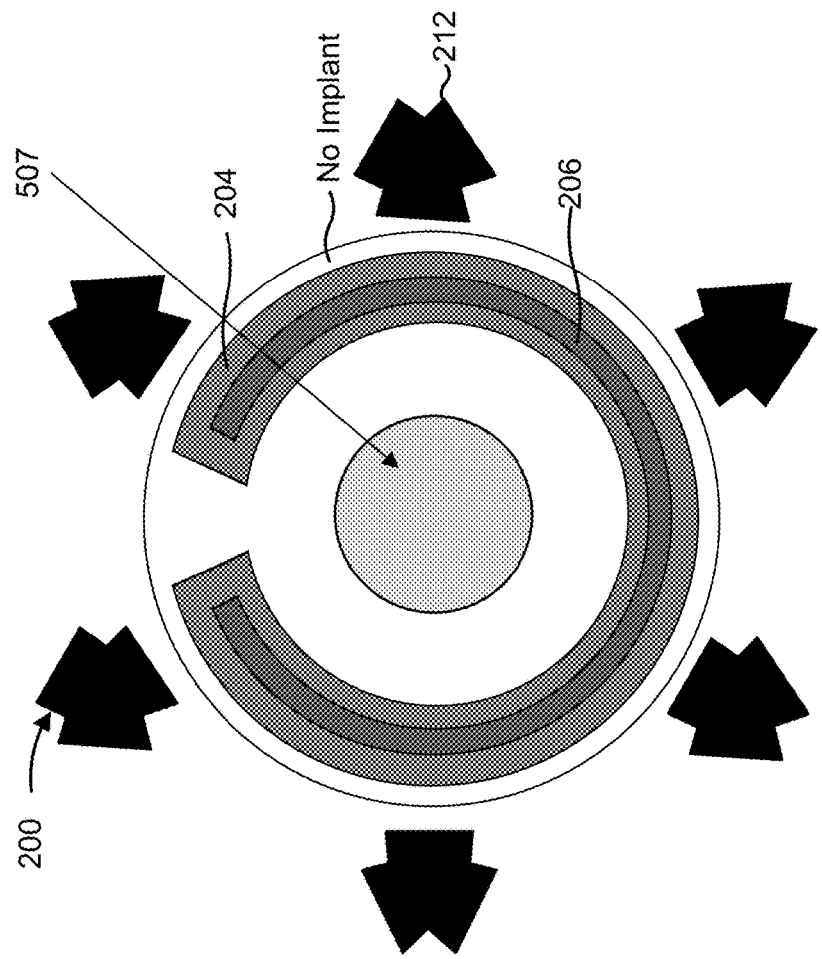
Figure 5H:
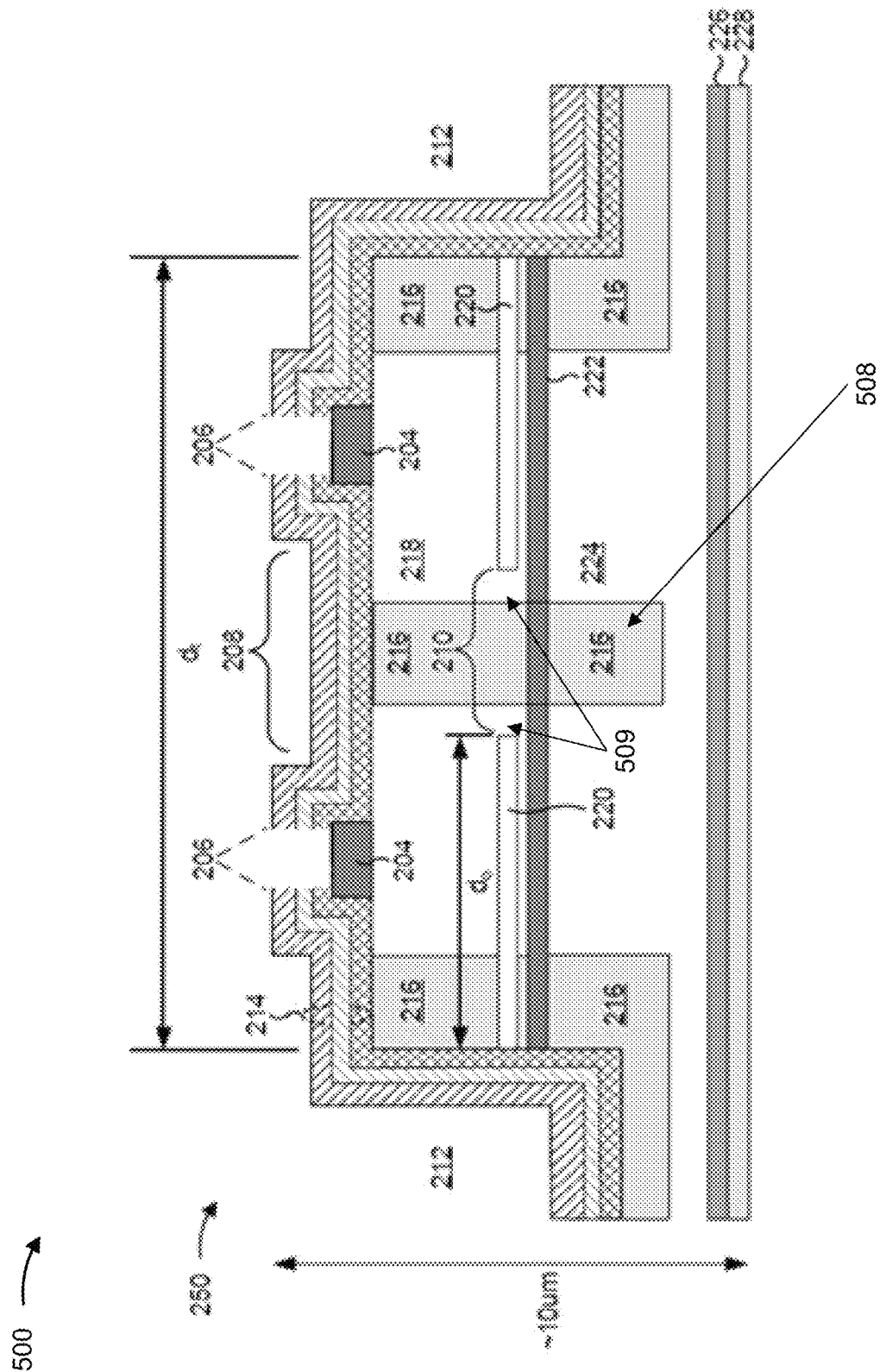

FIG. 5G shows a top-view of a degraded emitter 200 that includes an emitter center current blocking implant. For example, reference number 507 shows that the degraded emitter 200 includes an emitter center current blocking implant (shown by the light gray area) (e.g., implant isolation material 216) in a center or the degraded emitter 200. Specifically, the degraded emitter 200 includes the emitter center current blocking implant in a center of the no implant area (shown by the white area) described with regard to the non-degraded emitter 200. FIG. 5H shows a cross-sectional view 250 of the degraded emitter 200 that includes the emitter center current blocking implant. For example, and as shown by reference number 508, the emitter center current blocking implant may be positioned in a middle of current confinement aperture 210 and may extend through or into top mirror 218, active region 222, and bottom mirror 224. As shown by reference number 509, despite this configuration of the emitter center current blocking implant, the emitter center current blocking implant 216 may not completely block top mirror 218, active region 222, and bottom mirror 224.

As such, in some implementations, the degraded emitter 200 may have an optical output power at Vop, but that is substantially less than the nominal optical output power of the non-degraded emitter 200. For example, the degraded emitter 200 may have less than approximately 5 percent of the optical output power of the non-degraded emitter 200 at Vop. In some implementations, the degraded emitter 200 may draw less electrical power than the non-degraded emitter 200. For example, the degraded emitter 200 may have an electrical power draw that is less than approximately 20 percent of the electrical power draw of the non-degraded emitter 200 at Vop. In some implementations, the emitter center current blocking implant may include a proton implant, and/or another similar type of implant.

Figure 5I:
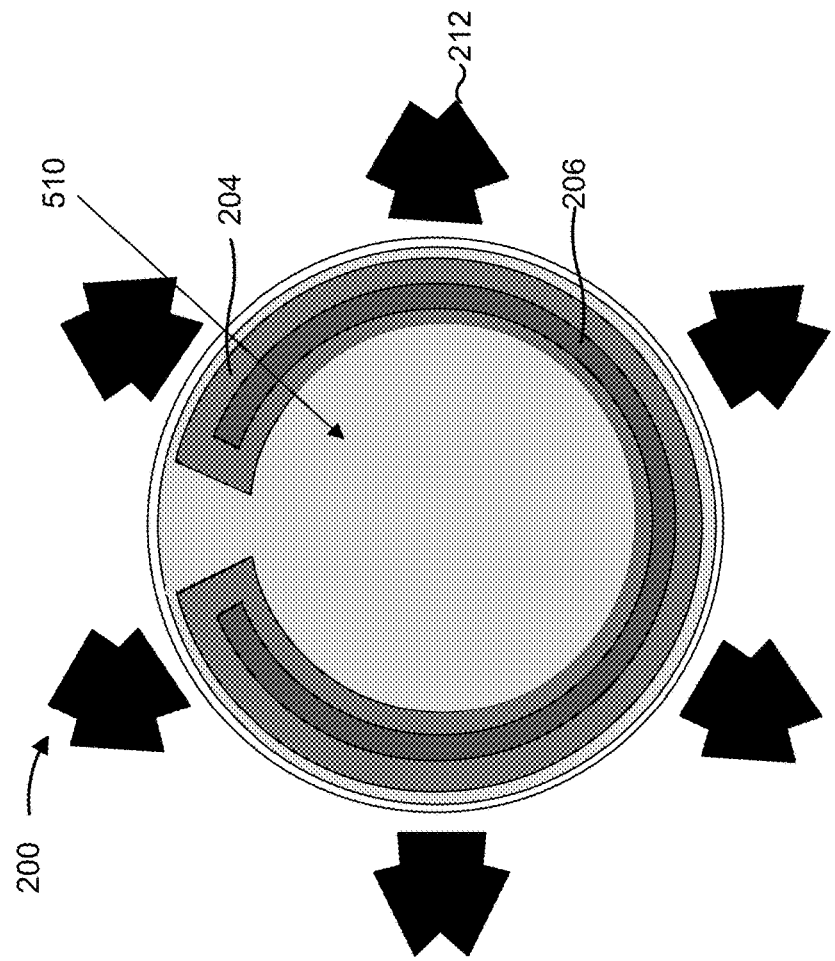
Figure 5J:
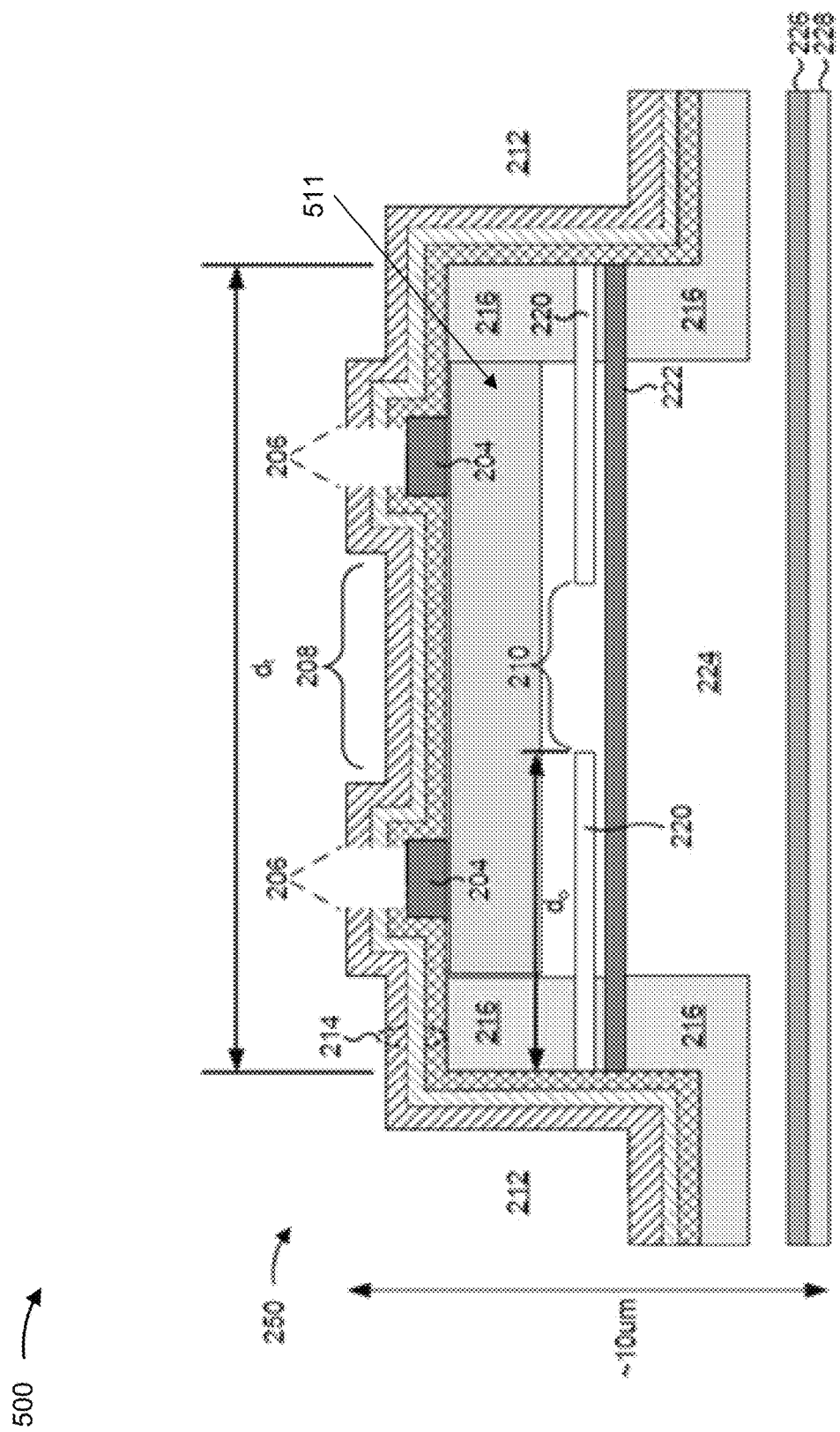

FIG. 5I shows a top-view of a degraded emitter 200 that includes a high doped lossy implant. For example, and as shown by reference number 510, the degraded emitter 200 may include a high doped lossy implant (shown by the light gray area) in the no implant area (shown by the white area) described with regard to the non-degraded emitter 200. FIG. 5J shows a cross-sectional view 250 of the degraded emitter 200 that includes the high doped lossy implant. As shown by reference number 511, the high doped lossy implant may extend the width of top mirror 218 (reference number not shown) between portions of implant isolation material 216. In this way, the high doped lossy implant may be positioned between P-Ohmic metal layer 204 and top mirror 218.

As such, in some implementations, the degraded emitter 200 may have a reduced optical output power relative to the non-degraded emitter 200 at Vop. For example, the degraded emitter 200 may have less than approximately 5 percent of the optical output power as the non-degraded emitter 200 based on the degraded emitter 200 including the high doped lossy implant. In some implementations, the degraded emitter 200 may experience little or no reduction in electrical power draw based on including the high doped lossy implant. For example, the degraded emitter 200 may have approximately the same electrical power draw as the non-degraded emitter 200 at Vop. In some implementations, the high doped lossy implant may include a high doped beryllium implant, and/or another similar type of implant.

Figure 5K:
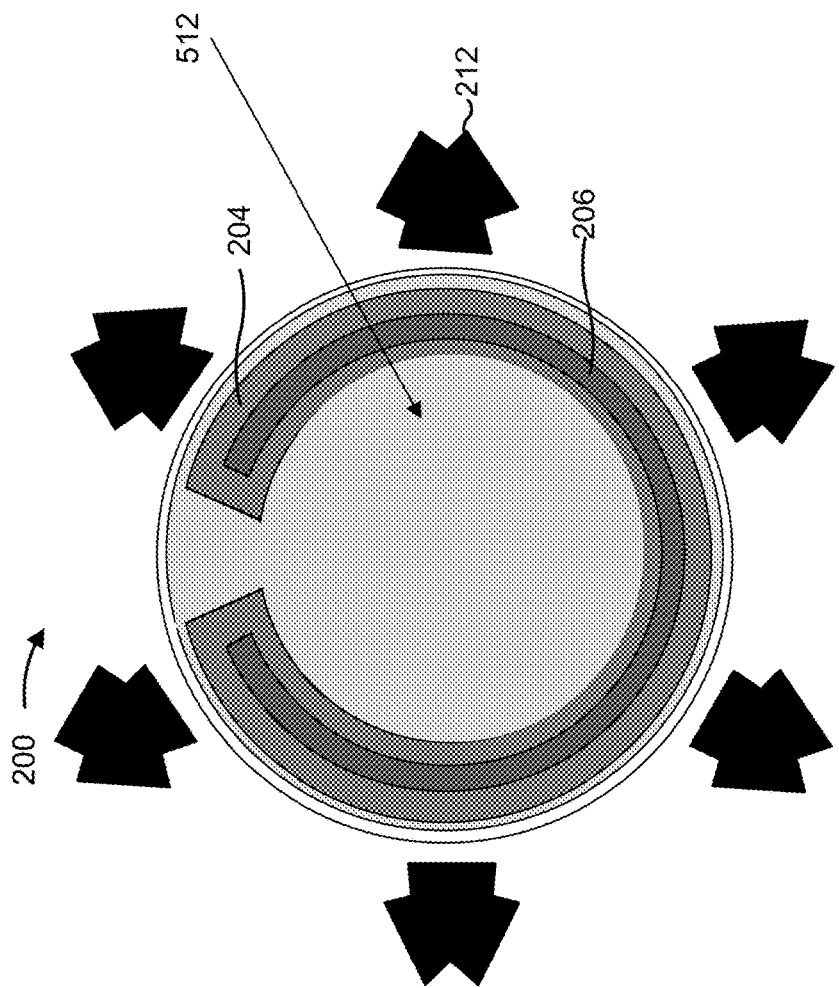
Figure 5L:
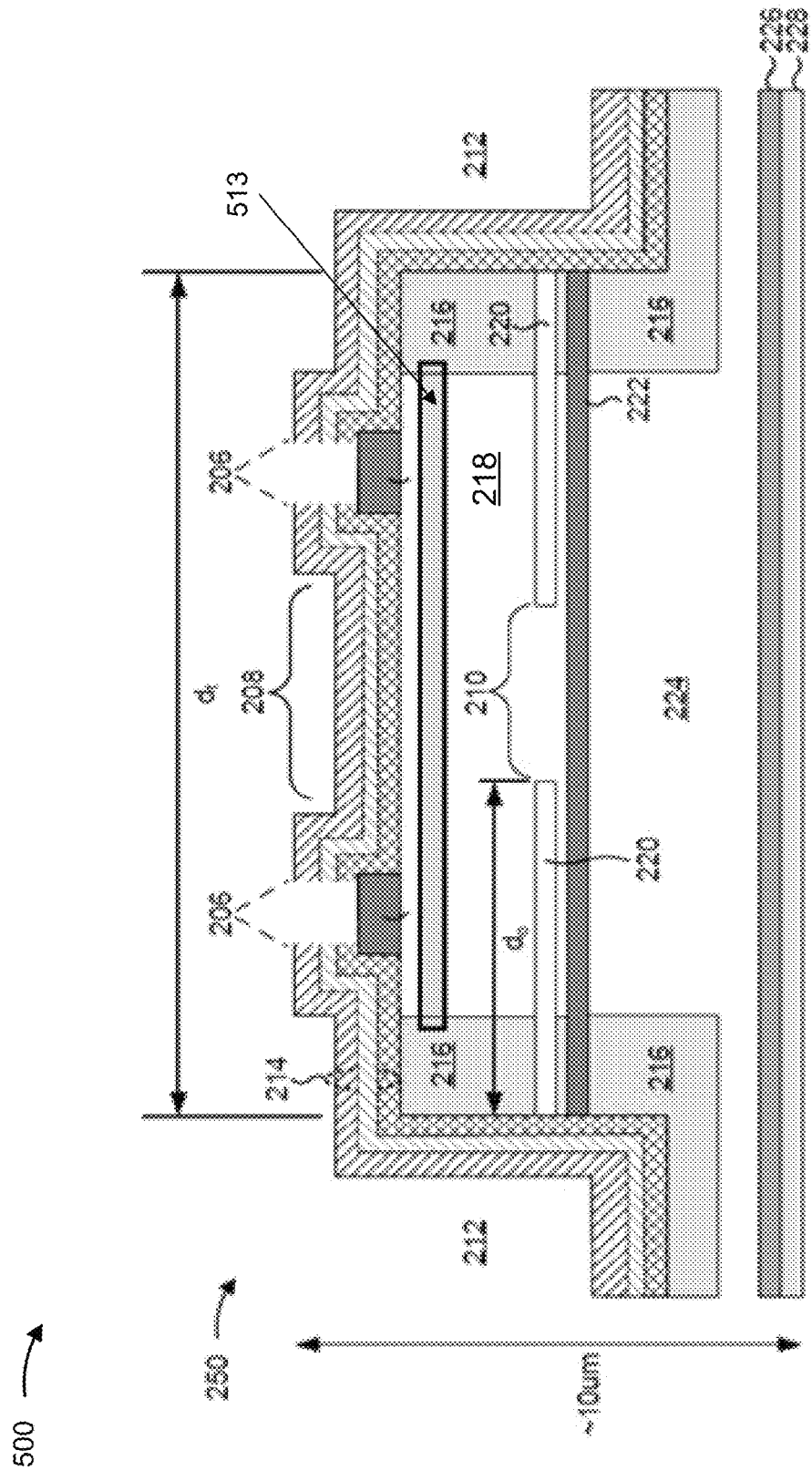

FIG. 5K shows a top view of a degraded emitter 200 that includes a high doped implant for current blocking. For example, and as shown by reference number 512, the degraded emitter 200 may include a high doped implant for current blocking (e.g., p-n-p current blocking) (shown by the light gray area) in the no implant area (shown by the white area) described with regard to the non-degraded emitter 200. In some implementations, and as further shown in FIG. 5K, the high doped implant may include a silicone implant, such as a high negative doped implant (e.g., a n++ implant), and/or another similar type of implant. FIG. 5L shows a cross-sectional view 250 of the degraded emitter 200 that includes the high doped implant for current blocking. For example, and as shown by reference number 513, the high doped implant may extend the width of top mirror 218 between portions of implant isolation material 216. Continuing with the previous example, the high doped implant may be positioned beneath P-Ohmic metal layer 204.

As such, in some implementations, the degraded emitter 200 may have reduced optical output power relative to the non-degraded emitter 200 at Vop. For example, the degraded emitter 200 may have little or no optical output power at Vop. In some implementations, the degraded emitter 200 may have reduced electrical power draw relative to the non-degraded emitter 200 at Vop. For example, the degraded emitter 200 may have little or no electrical power draw at Vop.

Figure 5M:
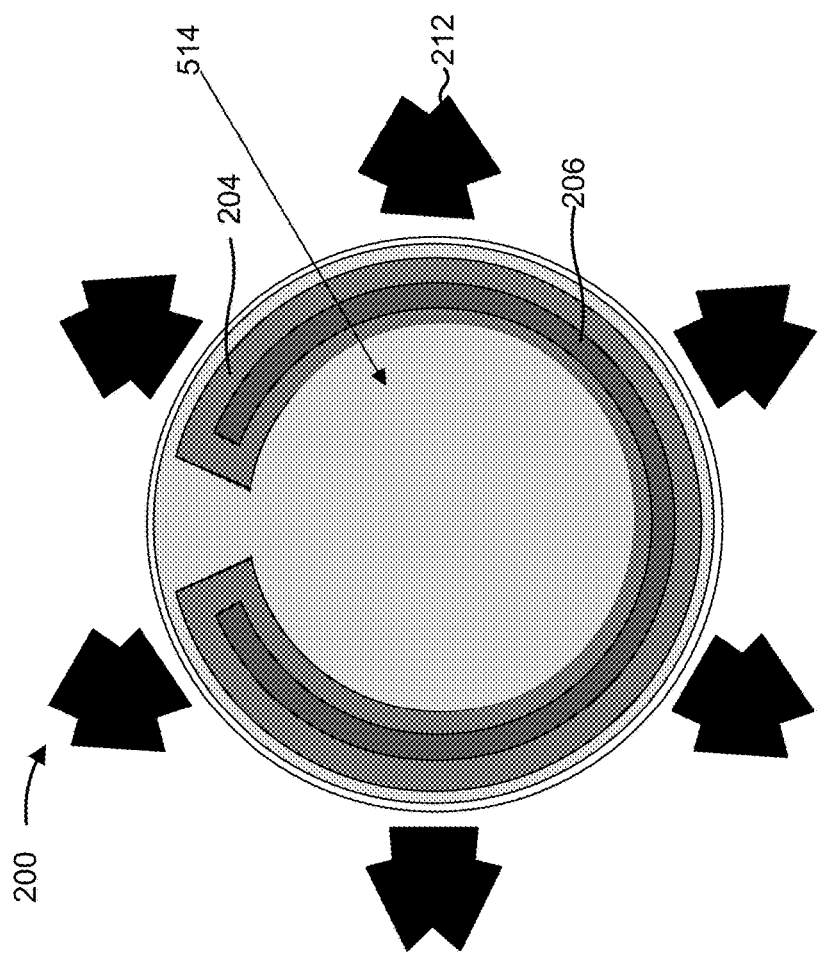
Figure 5N:
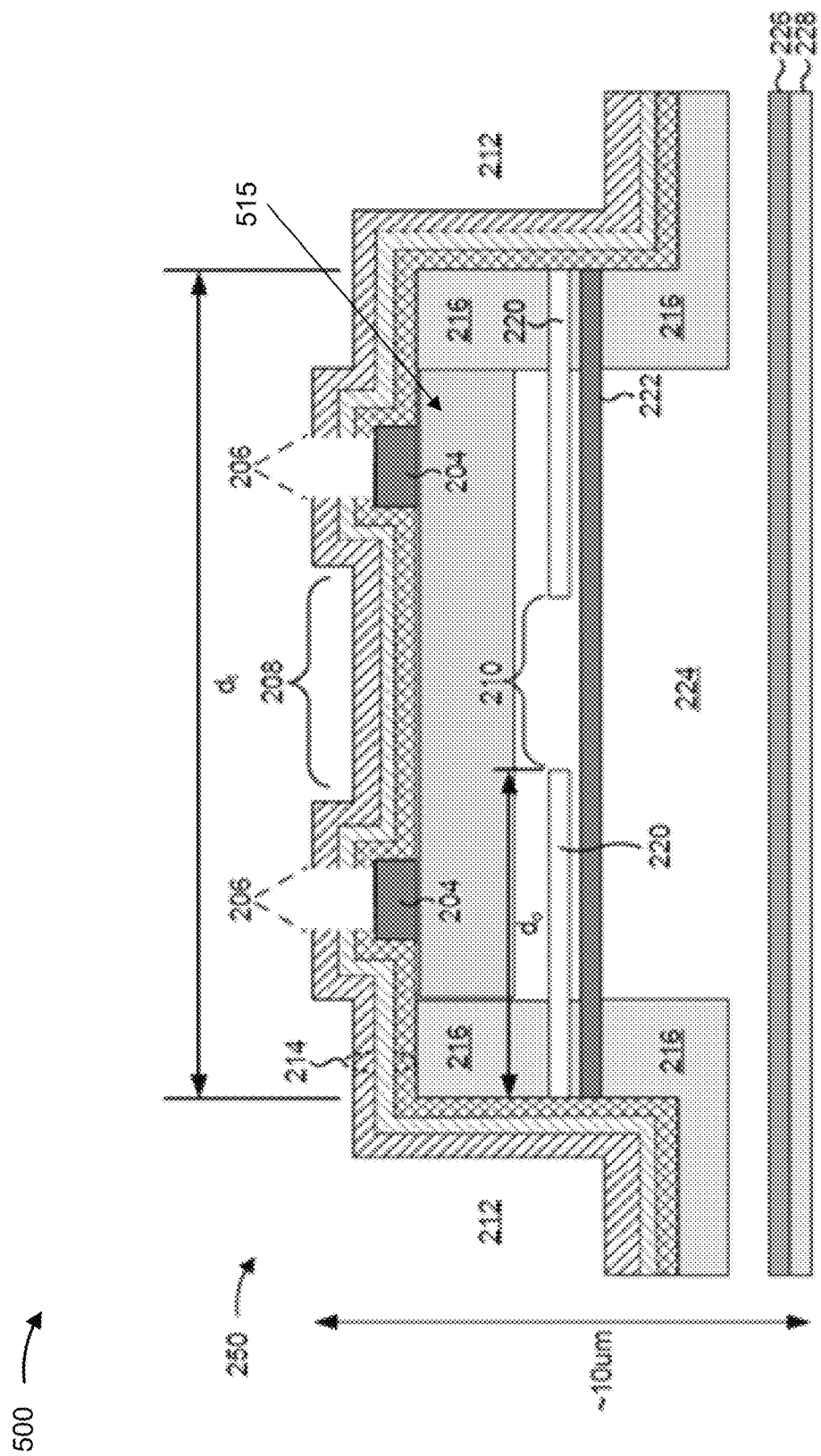

FIG. 5M shows a top-view of a degraded emitter 200 that includes a damaging implant for higher resistance. For example, and as shown by reference number 514, the degraded emitter 200 may include a damaging implant (shown by the light gray area) for higher resistance in the no implant area (shown by the white area) described with regard to the non-degraded emitter 200. In some implementations, and as shown in FIG. 5M, the damaging implant may include a lightly damaging implant that does not make the degraded emitter 200 completely resistant to electrical current. FIG. 5N shows a cross-sectional view 250 of the degraded emitter 200 that includes a damaging implant for higher resistance. As shown by reference number 515, the damaging implant may be located below P-Ohmic metal layer 204 and may extend between portions of implant isolation material 216. As further shown in FIG. 5N, the damaging implant may be included in top mirror 218 (e.g., in the DBR of top mirror 218) and may extend a width of top mirror 218.

As such, in some implementations, the degraded emitter 200 may have a reduced optical output power relative to the non-degraded emitter 200 at Vop. For example, the degraded emitter 200 may have less than approximately 5 percent of the optical output power as the non-degraded emitter 200 at Vop. In some implementations, the degraded emitter 200 may have a reduced electrical power draw relative to the non-degraded emitter 200 at Vop based on including the damaging implant. For example, the degraded emitter 200 may have an electrical power draw that is less than approximately 20 percent of the electrical power draw as the non-degraded emitter 200 at Vop.

Figure 5P:
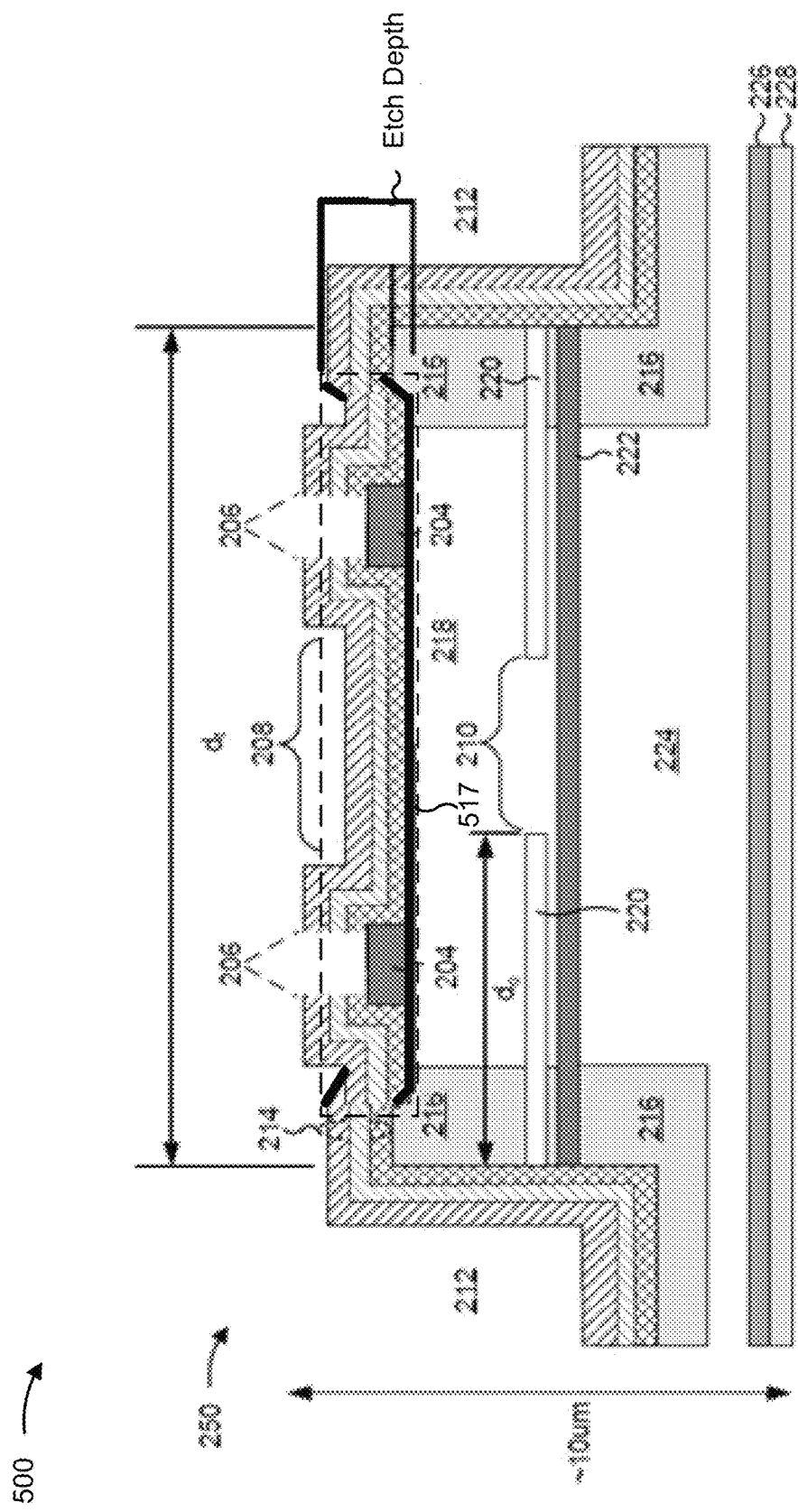

FIG. 5O shows a top-view of a degraded emitter 200 that includes etching for modified optical output power. For example, and as shown by reference number 516, the degraded emitter 200 may include etching around various components of the degraded emitter 200 (e.g., around a no implant area (shown by the white area), various P-Ohmic contacts, various P-vias, and/or the like associated with the degraded emitter 200). Continuing with the previous example, the etching is shown by the dotted ring. In some implementations, and as further shown in FIG. 5O, the etch may include an etch into gallium arsenide (GaAs), or another material, associated with a mesa of the degraded emitter 200 inside a ring of trenches (e.g., oxidation trenches 212) associated with the degraded emitter 200. In some implementations, the etching may cause the degraded emitter 200 to be out of phase and/or to have poor contact resistance. FIG. 5P shows a cross-sectional view 250 of the degraded emitter 200 that includes etching for modified optical output power. As shown by reference number 517, the etching may extend around dielectric via openings 206 and to a depth of approximately the top mirror 218.

As such, in some implementations, the degraded emitter 200 may have a reduced optical output power relative to the non-degraded emitter 200 at Vop. For example, the degraded emitter 200 may have less than approximately five percent of the optical output power as the non-degraded emitter 200 at Vop. In some implementations, the degraded emitter 200 may have a reduced electrical power draw relative to the non-degraded emitter 200 at Vop. For example, the degraded emitter 200 may have less than approximately five percent of the electrical power draw as the non-degraded emitter 200 at Vop.

Figure 5Q:
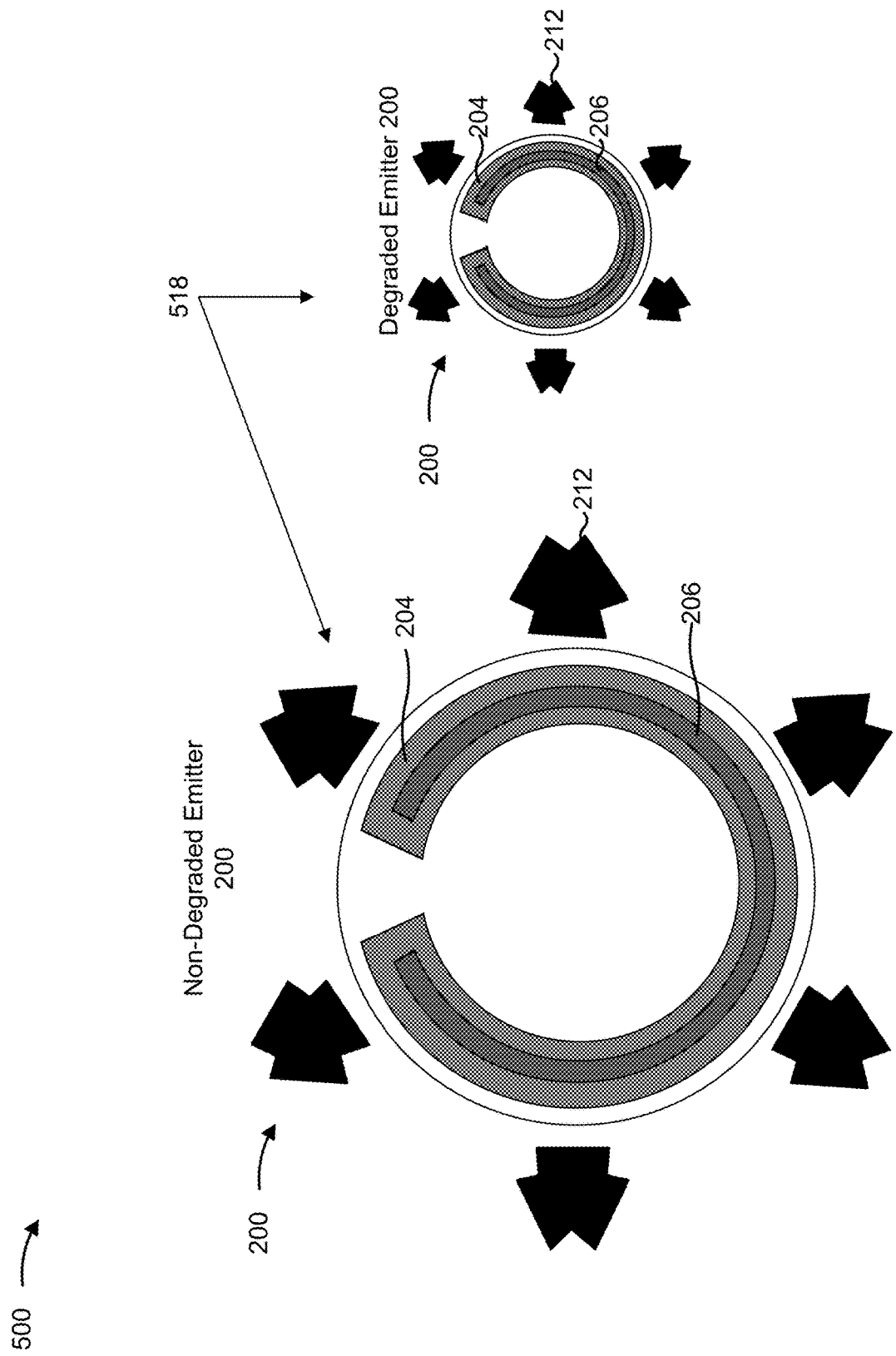

FIG. 5Q shows a top-view of a degraded emitter 200 that includes a narrower optical aperture diameter relative to the non-degraded emitter 200. For example, and shown by reference number 518 the degraded emitter 200 has a narrower optical aperture diameter relative to the non-degraded emitter 200. In some implementations, an amount by which the optical aperture diameter is smaller than that for the non-degraded emitter 200 may depend on amount by which optical output power of the degraded emitter 200 is to be reduced. For example, a greater difference between the size of the optical aperture diameter for the non-degraded emitter 200 and the degraded emitter 200 may result in a greater difference between the optical output power of the non-degraded emitter 200 and the degraded emitter 200.

In some implementations, the smaller optical aperture diameter of the degraded emitter 200 may be a result of a deviation from the structure of the non-degraded emitter 200. For example, the smaller optical aperture diameter may be a result of increasing a width of oxidation trenches 212 associated with the degraded emitter 200, reducing a mesa size of the degraded emitter 200, reducing a trench-to-trench distance of the degraded emitter 200, and/or the like.

Figure 5R:
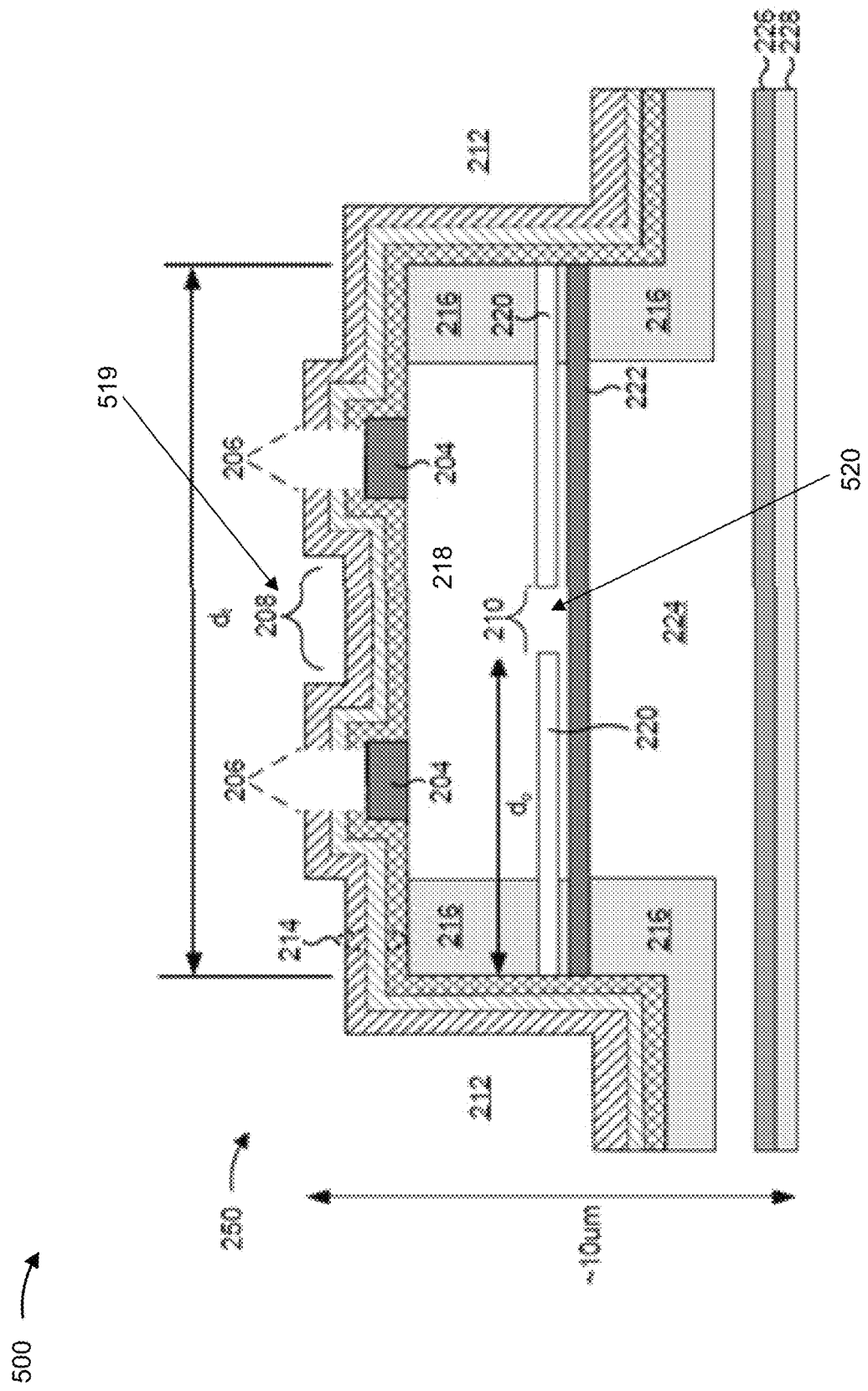

FIG. 5R shows a cross-sectional view 250 of the degraded emitter 200 with a narrower optical aperture diameter. As shown by reference number 519, the degraded emitter 200 may include a narrower optical aperture 208 relative to the non-degraded emitter 200. As such, and as shown by reference number 520, the degraded emitter 200 may include a narrower current confinement aperture 210 relative to the non-degraded emitter 200.

As such, the degraded emitter 200 may have a reduced optical output power relative to the non-degraded emitter 200. For example, the degraded emitter 200 may have an optical output power that is less than approximately 20 percent of the optical output power of the non-degraded emitter 200. In some implementations, the degraded emitter 200 may have a reduced electrical power draw relative to the non-degraded emitter 200. For example, the degraded emitter 200 may have less than approximately 20 percent of the electrical power draw as the non-degraded emitter 200.

Figure 5S:
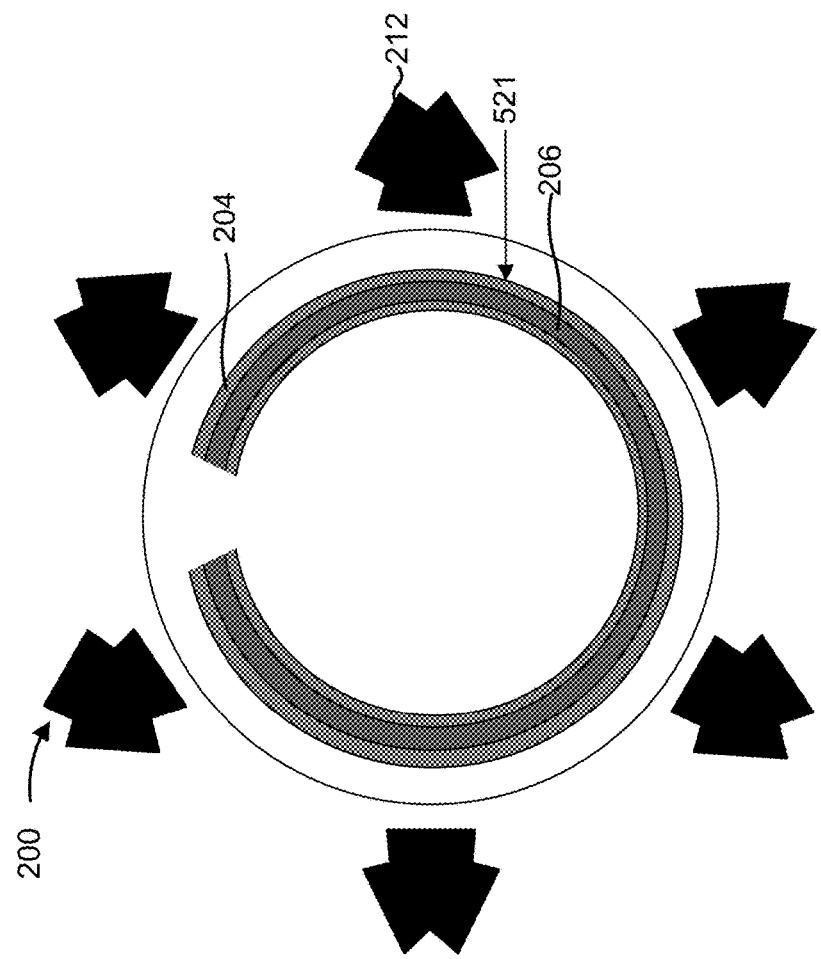
Figure 5T:
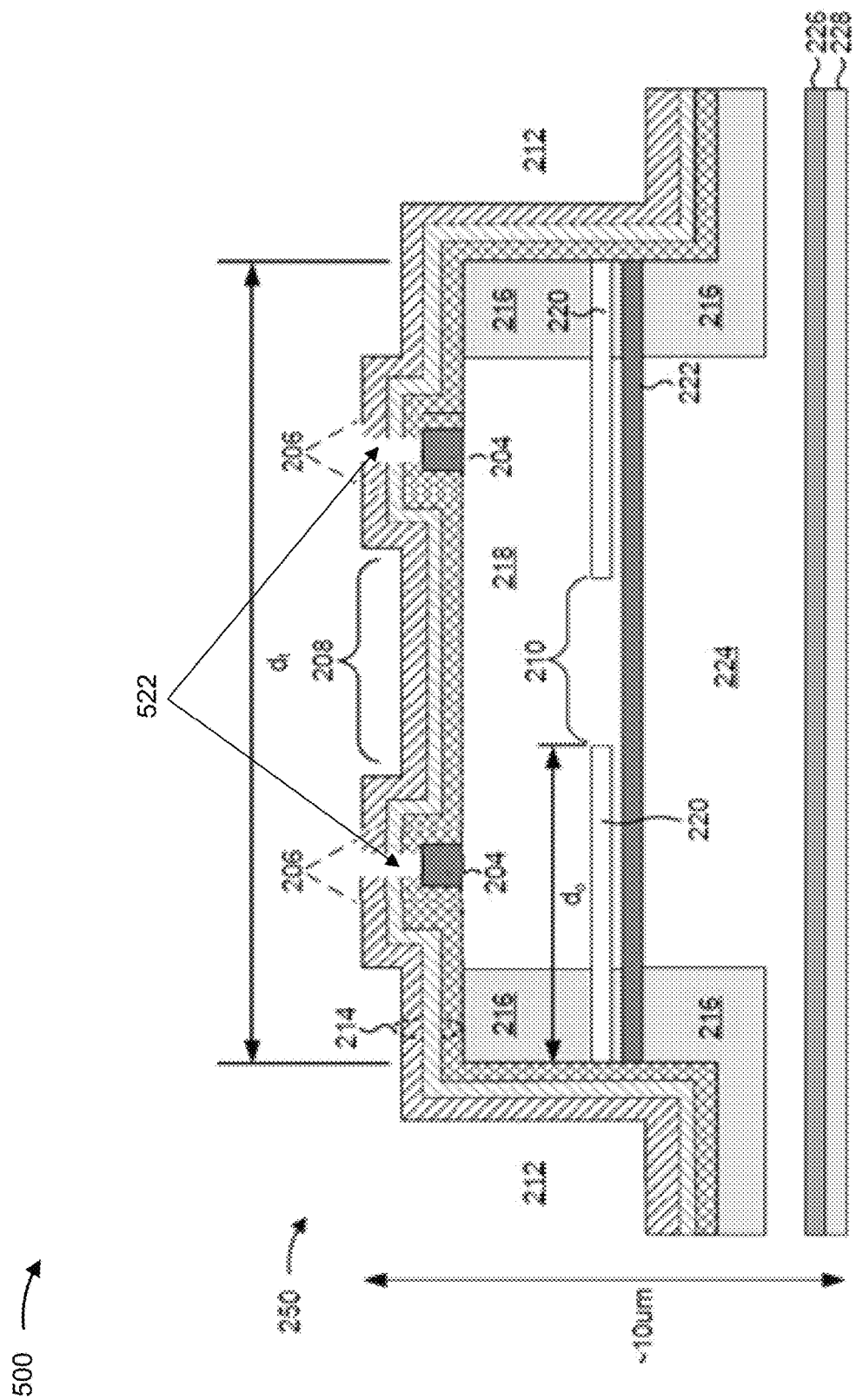

FIG. 5S shows a top-view of a degraded emitter 200 that includes a reduced metal contact area (e.g., a reduced P-Ohmic contact area). For example, and as shown by reference number 521, the degraded emitter 200 may include a similar quantity and/or configuration of P-Ohmic contacts as the non-degraded emitter 200, however the degraded emitter 200 may include a reduced metal contact area relative to the non-degraded emitter 200, such as to increase an electrical resistance of the degraded emitter 200. FIG. 5T shows a cross-sectional view of the degraded emitter 200 that includes the reduced metal contact area. For example, and as shown by reference number 522, P-Ohmic metal layer 204 of the degraded emitter 200 may be narrower than the P-Ohmic metal layer of the non-degraded emitter 200. This reduces the contact area of the P-Ohmic metal layer 204.

As such, in some implementations, the degraded emitter 200 may have a reduced optical output power relative to the non-degraded emitter 200. For example, the degraded emitter 200 may have an optical output power that is less than approximately 20 percent of the optical output power of the non-degraded emitter 200. In some implementations, the degraded emitter 200 may have a reduced electrical power draw relative to the non-degraded emitter 200. For example, the degraded emitter 200 may have an electrical power draw that is less than approximately 20 of the electrical power draw of the non-degraded emitter 200.

Figure 5U:
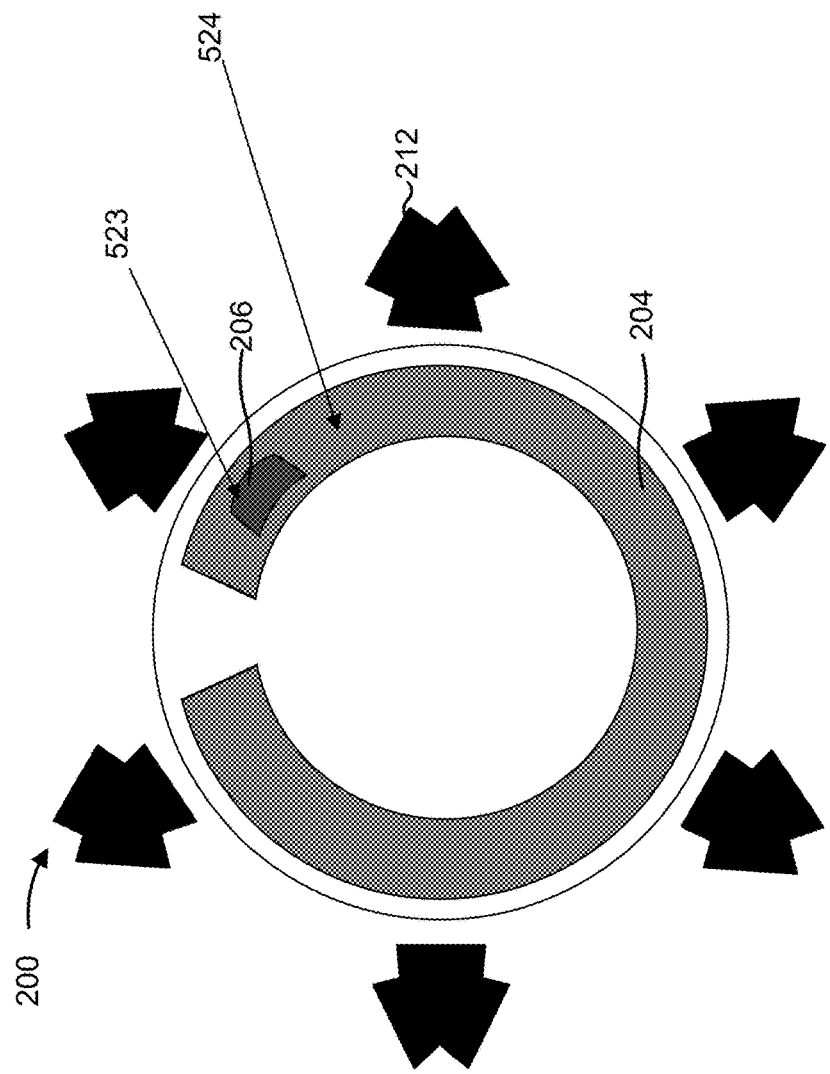

FIG. 5U shows a top-view of a degraded emitter 200 that includes a reduced quantity and/or size of metal contacts (e.g., P-Ohmic contacts) and/or vias associated with the metal contacts (e.g., P-vias). For example, and as shown by reference numbers 523 and 524, the degraded emitter 200 may include a single via associated with metal contacts of the degraded emitter 200 and a no implant area (shown by the white area). This is in contrast to the non-degraded emitter 200, which includes a larger sized via. In some implementations, the quantity and/or size of vias and/or metal contacts by which the degraded emitter 200 is reduced may depend on an amount by which optical output power and/or electrical current draw of the degraded emitter 200 is to be reduced. For example, the more the quantity and/or size is reduced relative to the non-degraded emitter 200, the greater the reduction in the optical output power and/or the electrical power draw of the degraded emitter 200 relative to the non-degraded emitter 200.

Figure 5V:
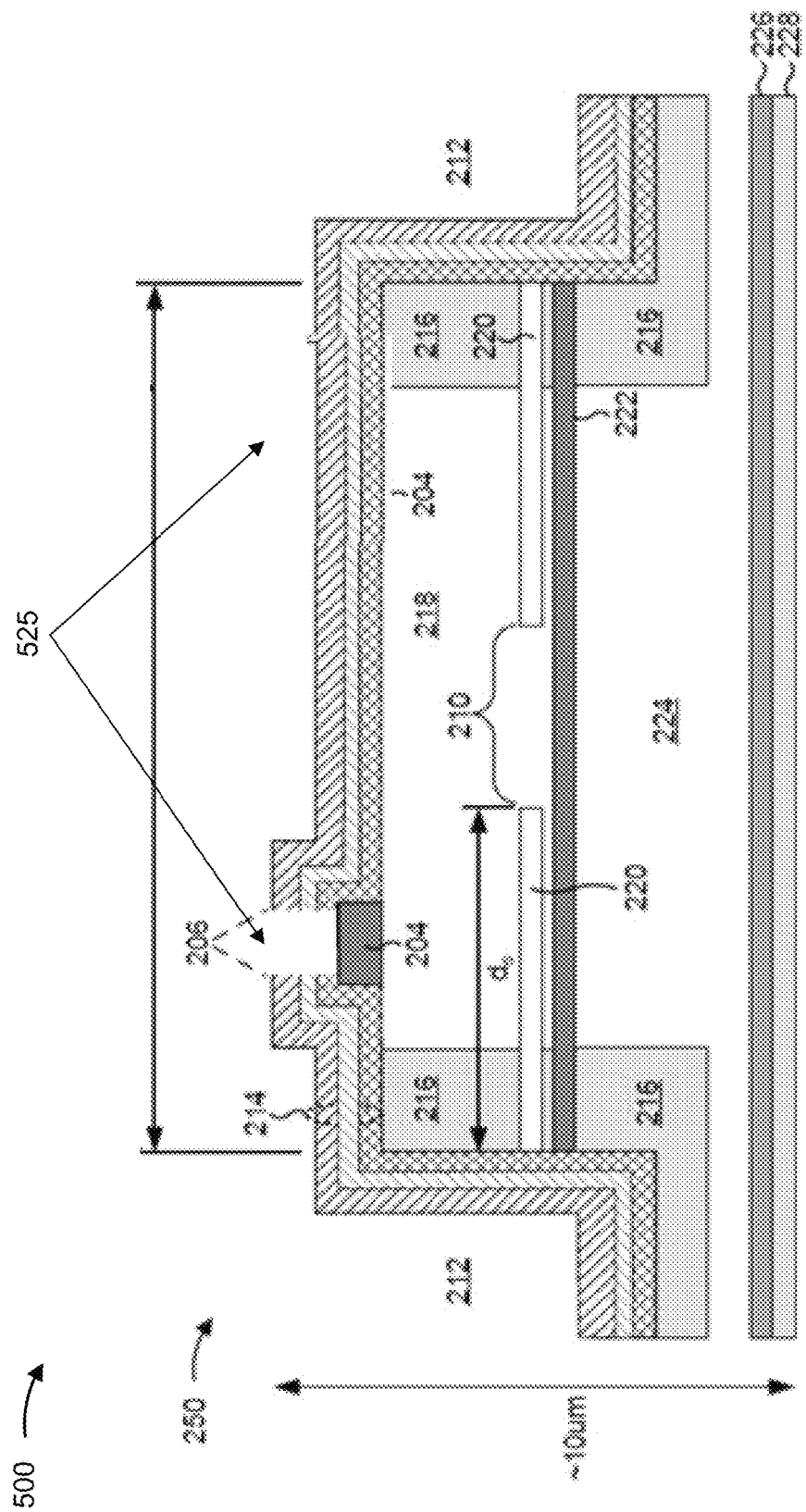

FIG. 5V shows a cross-sectional view of the degraded emitter 200 that includes a reduced quantity and/or size of metal contacts and/or vias associated with the metal contacts. For example, and as shown by reference number 525, the degraded emitter 200 may include a single dielectric via opening 206 for P-Ohmic metal layer 204 rather than two dielectric via openings 206 shown with respect to the cross-sectional view 250 of the non-degraded emitter 200 described above. In this way, the degraded emitter 200 may have an increased electrical resistance relative to the non-degraded emitter 200.

As such, the degraded emitter 200 may have a reduced optical output power relative to the non-degraded emitter 200. For example, the degraded emitter 200 may have less than approximately 20 percent of the optical output power of non-degraded emitter 200. In some implementations, the degraded emitter 200 may have a reduced electrical current draw relative to the non-degraded emitter 200. For example, the degraded emitter 200 may have less than approximately 20 percent of the electrical power draw as the non-degraded emitter 200.

Figure 5W:
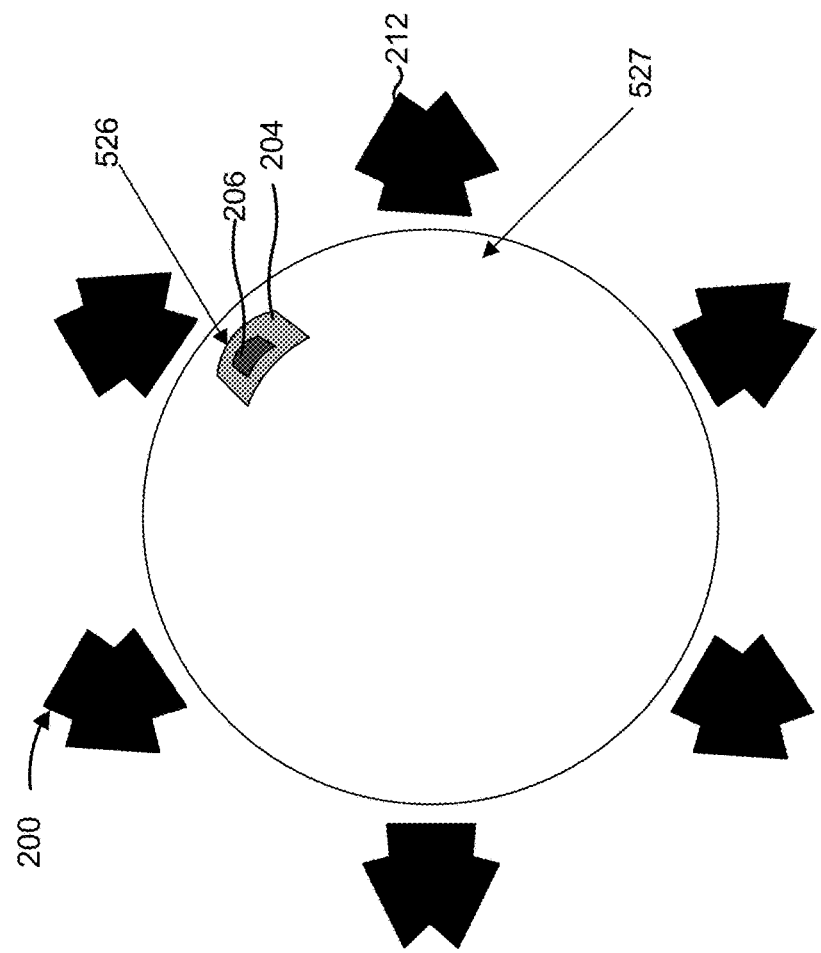

FIG. 5W shows a top-view of a degraded emitter 200 that includes a combination of the features described with regard to FIGS. 5S-5V. For example, FIG. 5W shows a top-view of a degraded emitter 200 that includes a combination of a reduced metal contact area (described with respect to FIGS.

5S and 5T) and a reduced quantity and/or size of metal contacts and/or vias associated with the metal contacts (described with respect to FIGS. 5U and 5V). As shown by reference numbers 526 and 527, the degraded emitter 200 may include a combination of a reduced metal contact area relative to the non-degraded emitter 200 and a reduced quantity and/or size of metal contacts and/or vias relative to the non-degraded emitter 200.

Figure 5X:
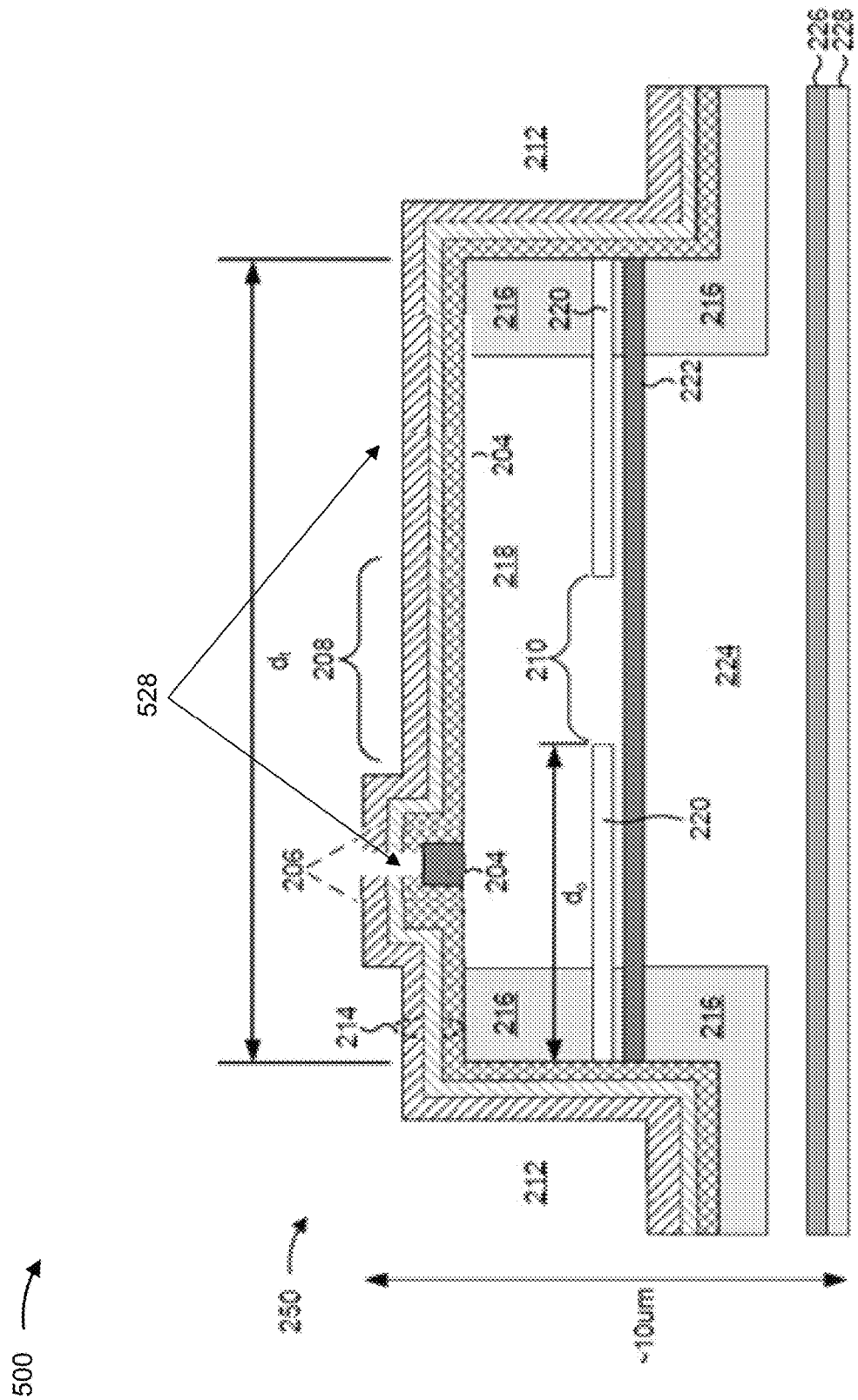

FIG. 5X shows a cross-sectional view 250 of the degraded emitter that includes the combination of the reduced metal contact area and the reduced quantity and/or size of metal contacts and/or vias associated with the metal contacts. For example, and as shown by reference number 528, the degraded emitter 200 may include a single contact for P-Ohmic metal layer 204 and a single dielectric via opening 206 associated with the single contact (compared to the two metal contacts shown in the cross-sectional view 250 for the non-degraded emitter 200). In addition, and as further shown by reference number 528, the single metal contact may have a reduced area relative to the metal contacts of the P-Ohmic metal layer 204 shown in the cross-sectional view 250 of the non-degraded emitter 200.

In some implementations, the quantity and/or size of metal contacts and/or vias reduced for the degraded emitter 200 may be based on an amount by which the optical output power is to be reduced for the degraded emitter 200 at Vop (e.g., a higher relative reduction in the quantity may result in a greater reduction in optical output power at Vop). Similarly, in some implementations, an amount by which the metal contact area is reduced may be based on an amount by which the optical output power is to be reduced for the degraded emitter 200 at Vop (e.g., a smaller relative metal contact area may result in a greater reduction in optical power at Vop).

Figure 5Y:
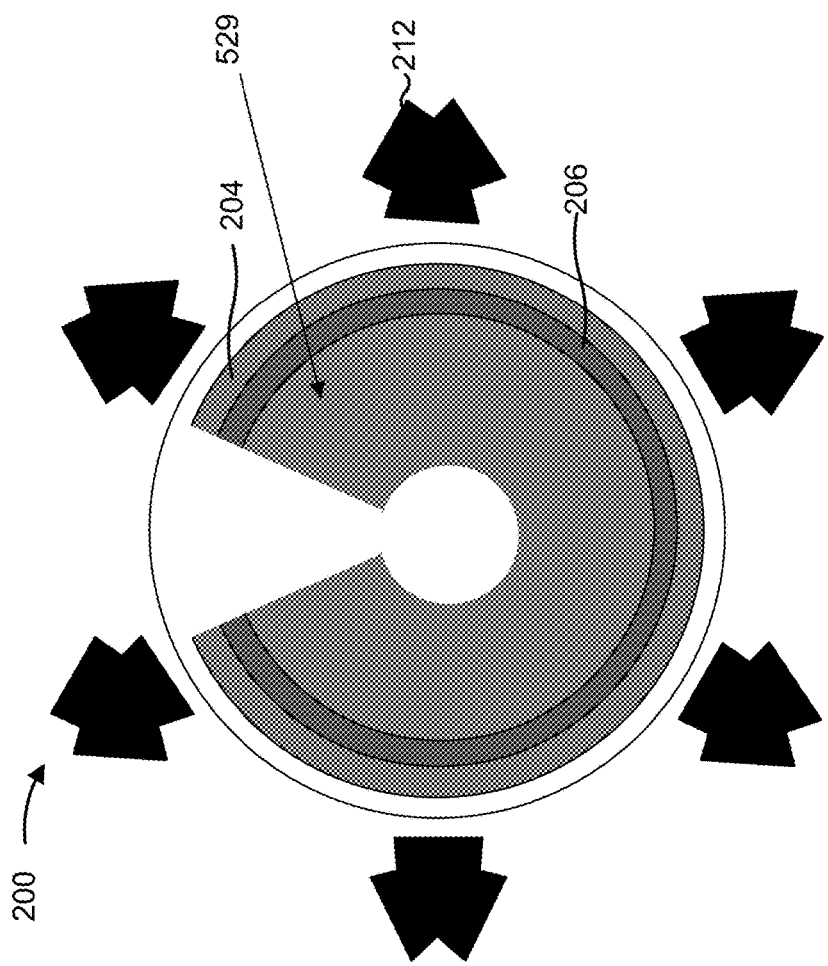

FIG. 5Y shows a top-view of a degraded emitter 200 that includes larger metal contacts for blocking optical output. For example, and as shown by reference number 529, the degraded emitter 200 may include the larger metal contacts (e.g., a larger P-Ohmic area) in an area of the degraded emitter 200 that would otherwise be a no implant area of the non-degraded emitter 200. In this way, the current blocking implant may constrict an area of an optical aperture of the degraded emitter 200 via which light can be emitted. This reduces an amount of optical output (e.g., light emission) from the degraded emitter 200 at Vop.

Figure 5Z:
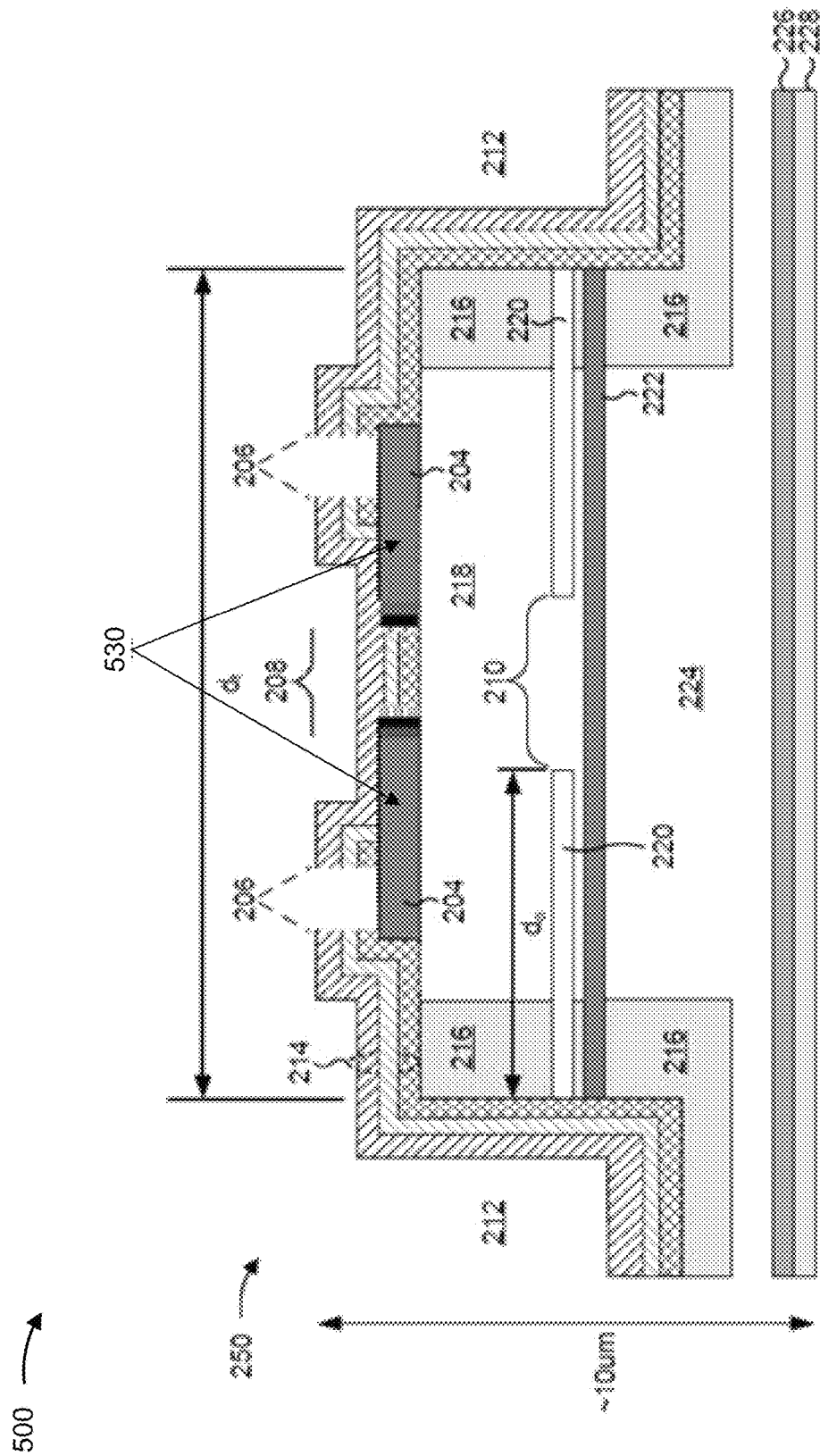
Figure 5A:
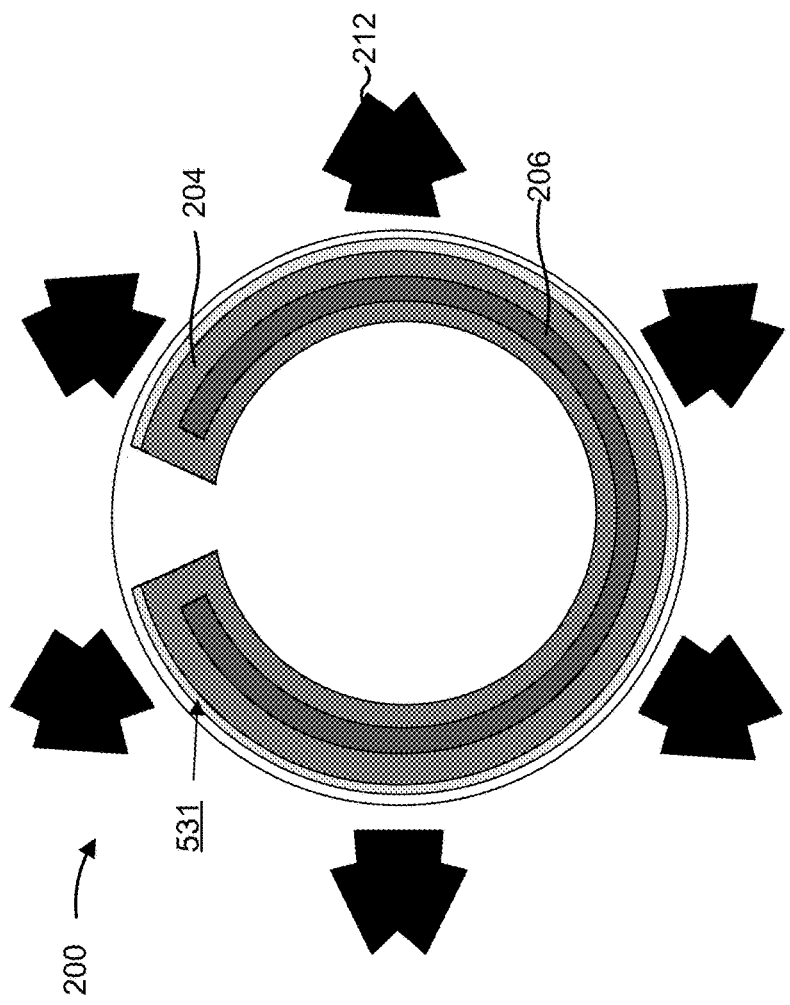
Figure 5B:
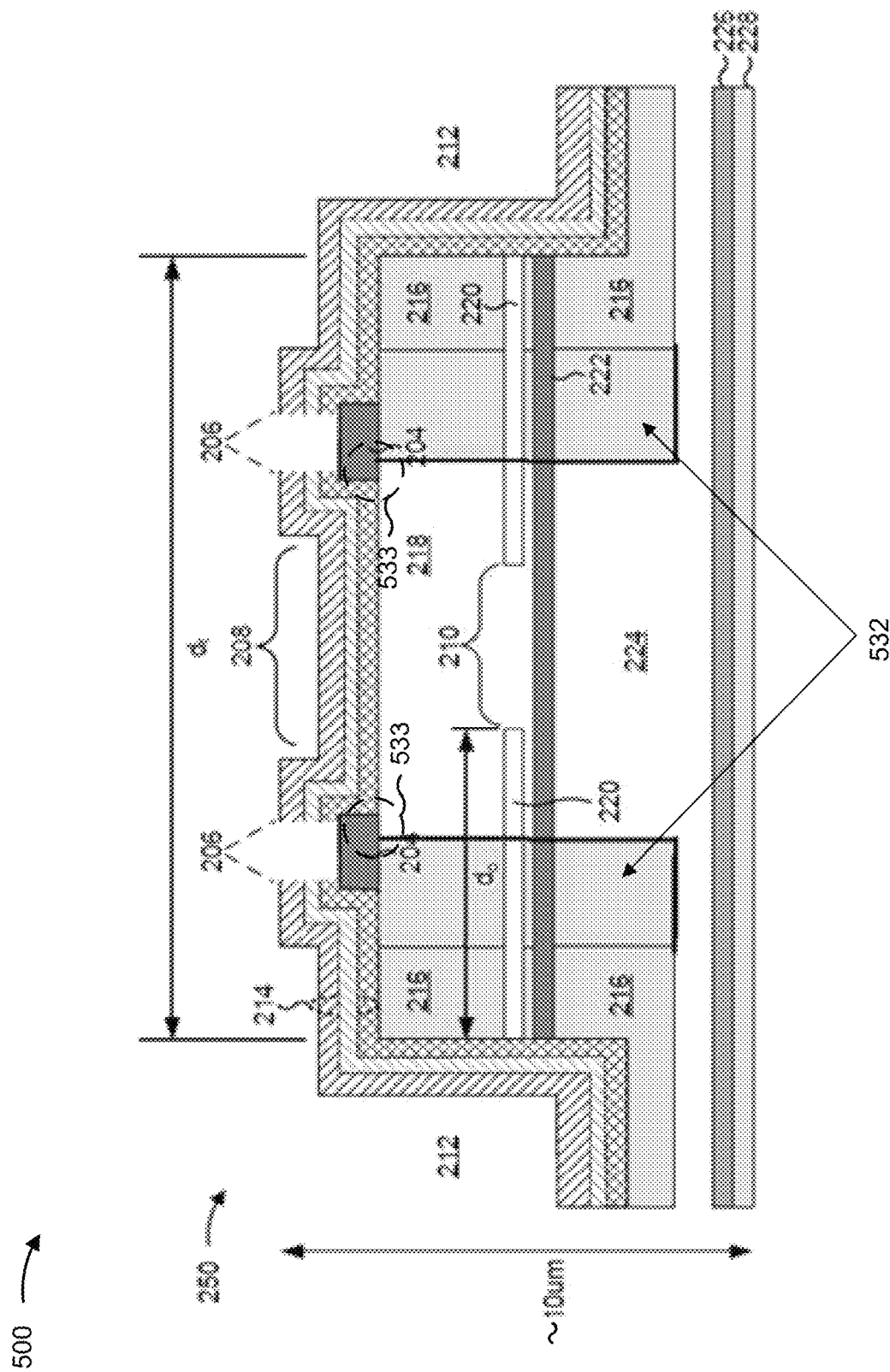

FIG. 5Z shows a cross-sectional view 250 of the degraded emitter 200 that includes the larger metal contacts for blocking optical output. As shown by reference number 530, a width of P-Ohmic metal layer 204 may be increased such that an area of optical aperture 208 via which light may be emitted from the degraded emitter 200 is reduced relative to the non-degraded emitter 200.

In some implementations, an optical output power of the degraded emitter 200 at Vop may be reduced relative to the non-degraded emitter 200 based on including larger metal contacts. For example, the optical output power of the degraded emitter 200 may be 20 percent or less of the optical output power of the non-degraded emitter 200 at Vop. In some implementations, an electrical power draw of the degraded emitter 200 may be approximately the same as the non-degraded emitter 200 at Vop.

FIG. 5AA shows a top-view of a degraded emitter 200 that includes a current blocking implant. For example, and as shown by reference number 531, the current blocking implant (shown by the light gray area between the white area and the medium gray area) may be located partially under a P-Ohmic contact of the degraded emitter 200. In some implementations, the current blocking implant may include a proton implant, and/or another similar type of implant.

FIG. 5BB shows a cross-sectional view 250 of the degraded emitter 200 that includes the current blocking implant. As shown by reference number 532, implant isolation material 216 may extend to form a narrower top mirror 218 and bottom mirror 224. As shown by reference numbers 533, the current blocking implant may extend under P-Ohmic metal layer 204, thereby increasing an electrical resistance of the degraded emitter 200.

As such, in some implementations, the degraded emitter 200 that includes the current blocking implant may have a reduced optical output power relative to the non-degraded emitter 200 at Vop. For example, the degraded emitter 200 may have an optical output power that is approximately five percent of the optical output power as the non-degraded emitter 200, depending on a percentage of the P-Ohmic metal layer that is blocked by the current blocking implant (e.g., more coverage may result in lower optical output power). In some implementations, the degraded emitter 200 may have a reduced electrical power draw related to the non-degraded emitter 200 at Vop. For example, the degraded emitter 200 may have an electrical power draw that is less than 20 percent of the non-degraded emitter 200.

As indicated above, FIGS. 5A-5BB are provided merely as an example. Other examples are possible and may differ from what was described with regard to FIGS. 5A-5BB. The number, arrangement, thicknesses, order, symmetry, or the like, of layers shown in FIGS. 5A-5BB is provided as an example. In practice, emitter 200 (e.g., a non-degraded emitter 200 or a degraded emitter 200) may include additional layers, fewer layers, different layers, differently constructed layers, or differently arranged layers than those shown in FIGS. 5A-5BB. Additionally, or alternatively, a set layers (e.g., one or more layers) of emitter 200 may perform one or more functions described as being performed by another set of layers of emitter 200.

Figure 6:
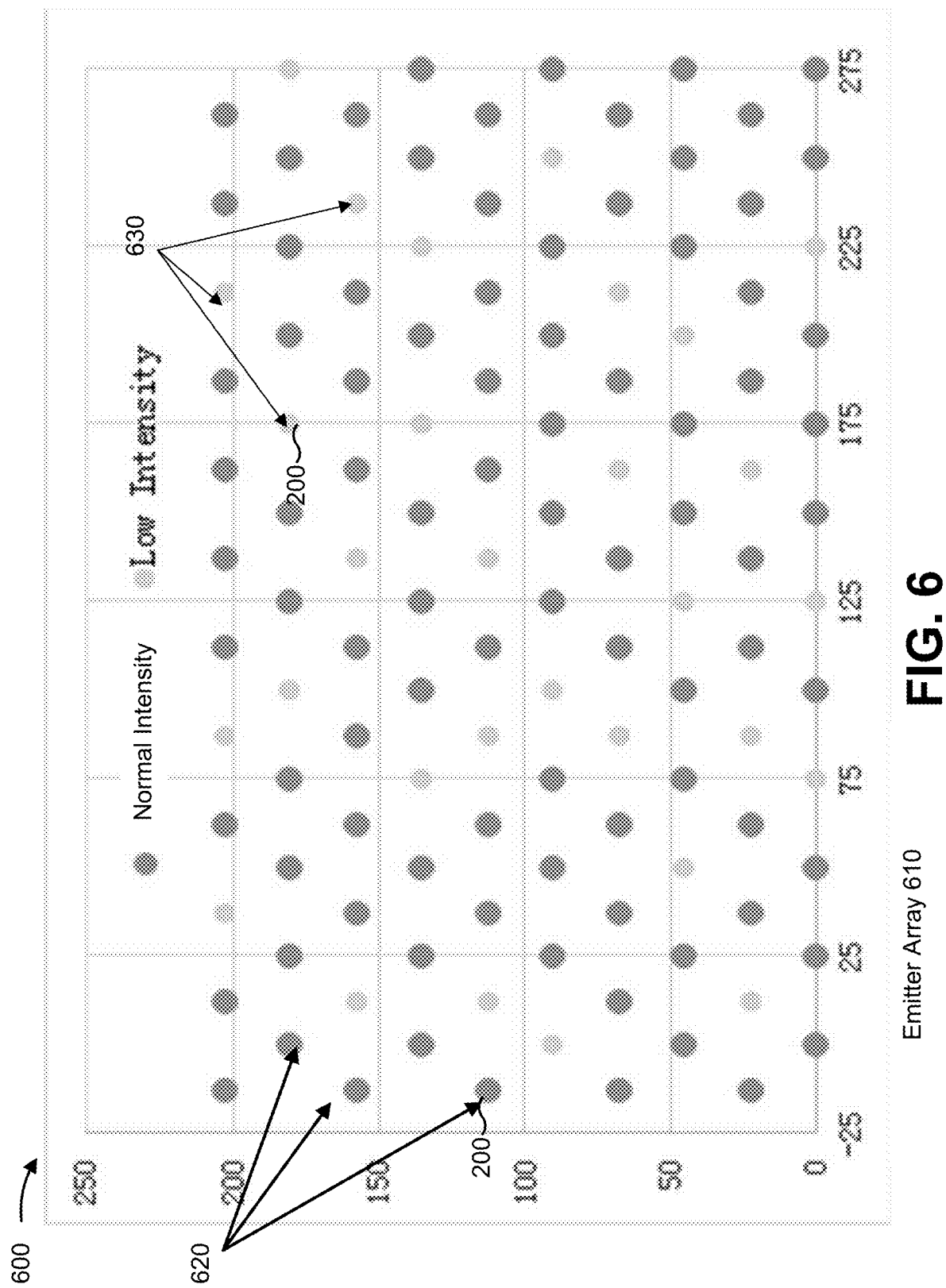
FIG. 6 is a diagram of an example implementation described herein.

FIG. 6 is a diagram of an example implementation 600 described herein. FIG. 6 shows an example emitter array 610 that includes non-degraded emitters 200 and degraded emitters 200 (referred to collectively as "emitters 200" for FIG. 6) similar to that described elsewhere herein. As further shown in FIG. 6, emitters 200 of emitter array 610 may be arranged into a regular two dimensional pattern that includes rows and/or columns of emitters 200. As shown by reference umber 620, a row and/or column of emitters 200 may include one or more non-degraded emitters 200 (shows as dark gray dots) that have a normal intensity optical output power at Vop (e.g., nominal optical output power). As shown by reference number 630, a row and/or column of emitters 200 may include one or more degraded emitters 200 (shown as light gray dots) that have a low intensity optical output power at Vop (e.g., substantially less than nominal optical output power or no optical power).

As further shown in FIG. 6, the non-degraded emitters 200 and the degraded emitters 200 may be interleaved with each other. For example, a row and/or column of emitters 200 may include one or more non-degraded emitters 200 and/or one or more degraded emitters 200. In addition, and as further shown in FIG. 6, the non-degraded emitters 200 and the degraded emitters 200 may be arranged within emitter array 610 such that the non-degraded emitters 200 form a random pattern of emitters 200 within the regular two-dimensional pattern of emitters 200. In some implementations, the random pattern of emitters 200 within emitter array 610 may be predictable. For example, the random pattern of emitters 200 may be a pre-designed or pre-determined random pattern, rather than a random pattern that occurs due to natural degradation of emitters 200 over time. In this way, when emitter array 610 is powered at Vop, emitter array 610 may output a random pattern of light.

As indicated above, FIG. 6 is provided merely as an example. Other examples are possible and may differ from what was described with regard to FIG. 6. The number and arrangement of components of emitter array 610 shown in FIG. 6 are provided as an example. In practice, emitter array 610 may include additional components, fewer components, different components, or differently arranged components than those shown in FIG. 6.

Figure 7:
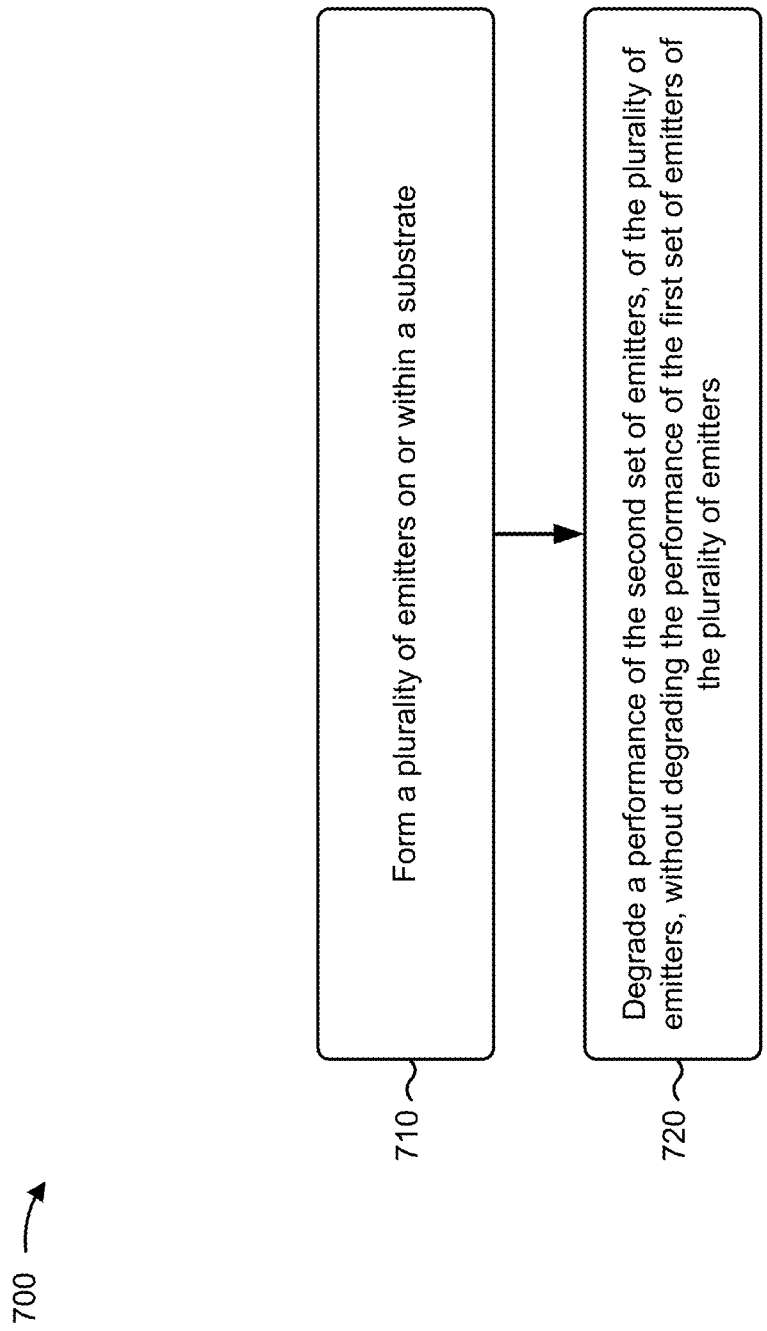
FIG. 7 is a flow chart of an example process for manufacturing a modified emitter array.

FIG. 7 is a flow chart of an example process 700 for manufacturing a modified emitter array. For example, FIG. 7 shows an example process for manufacturing a modified emitter array that includes non-degraded emitters 200 and degraded emitters 200 arranged within the emitter array in the manner described herein.

As shown in FIG. 7, process 700 may include forming a plurality of emitters on or within a substrate (block 710). For example, process 700 may include forming a plurality of emitter 200 on or within a substrate. In some implementations, forming the plurality of emitters may include forming a first set of emitters and a second set of emitters that is interleaved with each other and that form a two-dimensional regular pattern of emitters.

In some implementations, to form the plurality of emitters, various epitaxial layers may be formed on a substrate layer. For example, the substrate layer may include a gallium arsenide (GaAs) substrate. In some implementations, trenches may be etched into layers of the plurality of emitters (e.g., using a wet etching technique or a dry etching technique). For example, a set of oxidation trenches (e.g., oxidation trenches 212) may be etched into the layers of the plurality of emitters. In some implementations, the plurality of emitters may be formed in a pattern. For example, the plurality of emitters may be formed in a uniform pattern, such as a matrix pattern, a lattice pattern, and/or the like.

As further shown in FIG. 7, process 700 may include degrading a performance of the second set of emitters, of the plurality of emitters, without degrading the performance of the first set of emitters of the plurality of emitters (block 720). For example, process 700 may include degrading a performance of the second set of emitters (e.g., to form degraded emitters 200), of the plurality of emitters, without degrading the performance of the first set of emitters of the plurality of emitters (e.g., non-degraded emitters 200). In some implementations, degrading the performance of the second set of emitters may include degrading the performance of a random pattern of emitters within the two-dimensional regular pattern of emitters (e.g., pre-determined or pre-designed random pattern). In some implementations, degrading the performance of the second set of emitters includes degrading the performance of the second set of emitters such that the second set of emitters has substantially less optical output power than a nominal optical output power of the first set of emitters or has no optical output power (e.g., at Vop).

In some implementations, degrading the second set of emitters may include degrading the second set of emitters by including a respective current blocking implant in the second set of emitters. For example, the respective current blocking implant may include a proton implant. In some implementations, the respective current blocking implant may include a full emitter current blocking implant, an emitter perimeter current blocking implant, an emitter center current blocking implant, a current blocking implant under a respective P-Ohmic contact (e.g., P-Ohmic metal layer 204) of the second set of emitters, and/or the like. For example, the current blocking implant may include a current blocking implant similar to that described elsewhere herein.

Additionally, or alternatively, degrading the second set of emitters may include degrading the second set of emitters by including another type of respective implant in the second set of emitters. For example, the other type of respective implant may include a high doped lossy implant (e.g., a beryllium implant), a high doped implant for p-n-p blocking (e.g., a silicon implant), a damaging implant for higher resistance in a respective passive DBR (P-DBR) of the second set of emitters, and/or the like similar to that described elsewhere herein.

Additionally, or alternatively, degrading the second set of emitters may include damaging the second set of emitters by modifying a structure and/or size of a respective set of metal contacts (e.g., P-Ohmic metal layer 204) and/or a respective set of dielectric via openings (e.g., a respective set of dielectric via openings 206) of the second set of emitters. For example, degrading the second set of emitters may include reducing a size and/or area of the respective set of metal contacts and/or the respective set of dielectric via openings, reducing a quantity of the set of respective metal contacts and/or the set of respective dielectric via openings, and/or the like similar to that described elsewhere herein.

Additionally, or alternatively, degrading the second set of emitters may include damaging the second set of emitters in another manner. For example, degrading the second set of emitters may include damaging the second set of emitters by etching a portion of a respective mesa of the second set of emitters, by modifying a trench size of a respective set of trenches (e.g., a set of oxidation trenches 212) associated with the second set of emitters, and/or the like similar to that described elsewhere herein.

In some implementations, degrading the second set of emitters may occur during forming of the second set of emitters. Additionally, or alternatively, degrading the second set of emitters may occur after forming of the second set of emitters.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL) array, comprising:
    a first set of VCSELs; and
    a second set of VCSELs,
        wherein the second set of VCSELs includes at least one degraded VCSEL, the at least one degraded VCSEL comprising one or more of:
            a central current blocking implant, having an implant width less than a width of an active region of the degraded VCSEL, positioned substantially centrally with respect to a current confinement aperture of the degraded VCSEL,
            an etched surface extending around dielectric via openings of the degraded VCSEL and to a depth approximately at a top surface of a top mirror of the degraded VCSEL,
            or
            a reduced via, etched through a dielectric passivation/mirror layer of the degraded VCSEL to expose a metal layer, the reduced via having a reduced size relative to other vias of the VCSELs in the first set of VCSELs;
        wherein the first set of VCSELs and the second set of VCSELs are interleaved with each other to form a two-dimensional regular pattern of VCSELs; and
        wherein the second set of VCSELs forms a random pattern of VCSELs within the two-dimensional regular pattern of VCSELs.

2. The VCSEL array of claim 1, wherein each of the first set of VCSELs has a nominal optical output power at an operating voltage of the VCSEL array; and
    wherein each of the second set of VCSELs has substantially less than the nominal optical output power or no optical output power at the operating voltage.

3. The VCSEL array of claim 1, wherein a bottom mirror of each of the first set of VCSELs includes a distributed Bragg reflector (DBR), and a top mirror of each of the first set of VCSELs includes a DBR.

4. The VCSEL array of claim 1, wherein the active region of the at least one degraded VCSEL, and other active regions of the first set of VCSELs and the second set of VCSELS, comprise a quantum well.

5. The VCSEL array of claim 1, wherein the central current blocking implant includes a proton implant.

6. The VCSEL array of claim 1, wherein active regions of the first set of VCSELs and the second set of VCSELs are positioned between an oxidation layer and a bottom mirror.

7. The VCSEL array of claim 1, wherein the first set of VCSELs and the second set of VCSELs are electrically connected in parallel.

8. A method of forming a vertical cavity surface emitting laser (VCSEL) array, comprising:
    forming a plurality of VCSELs on or within a substrate,
        wherein forming the plurality of VCSELs includes forming a first set of VCSELs and a second set of VCSELs that is randomly interleaved with the first set of VCSELS and that form a two-dimensional regular pattern of VCSELs; and
    degrading a performance of the second set of VCSELs without degrading a performance of the first set of VCSELs,
        wherein degrading the performance of the second set of VCSELs includes forming at least one degraded VCSEL in the second set of VCSELs, the at least one degraded VCSEL comprising one or more of:
            a central current blocking implant, having an implant width less than a width of an active region of the degraded VCSEL, positioned substantially centrally with respect to a current confinement aperture of the degraded VCSEL,
            an etched surface extending around dielectric via openings of the degraded VCSEL and to a depth approximately at a top surface of a top mirror of the degraded VCSEL,
            or
            a reduced via, etched through a dielectric passivation/mirror layer of the degraded VCSEL to expose a metal layer, the reduced via having a reduced size relative to other vias of the VCSELs in the first set of VCSELs.

9. The method of claim 8, wherein each of the first set of VCSELs has a nominal optical output power at an operating voltage; and
    wherein each of the second set of VCSELs has substantially less than the nominal optical output power or no optical output power at the operating voltage.

10. The method of claim 8, wherein a bottom mirror of each of the first set of VCSELs includes a distributed Bragg reflector (DBR), and a top mirror of each of the first set of VCSELs includes a DBR.

11. The method of claim 8, wherein the active region of the at least one degraded VCSEL, and other active regions of the first set of VCSELs and the second set of VCSELS, comprise a quantum well.

12. The method of claim 8, wherein the central current blocking implant includes a proton implant.

13. The method of claim 8, wherein active regions of the first set of VCSELs and the second set of VCSELs are positioned between an oxidation layer and a bottom mirror.

14. The method of claim 8, wherein the first set of VCSELs and the second set of VCSELs are electrically connected in parallel.

15. An emitter array, comprising:
    a first set of emitters; and
    a second set of emitters;
        wherein the first set of emitters and the second set of emitters are interleaved with each other to form a two-dimensional regular pattern of emitters that emits a random pattern of light; and
        wherein the second set of emitters includes at least one degraded emitter, the at least one degraded emitter comprising one or more of:
            a central current blocking implant, having an implant width less than a width of an active region of the degraded emitter, positioned substantially centrally with respect to a current confinement aperture of the degraded emitter, an etched surface extending around dielectric via openings of the degraded emitter and to a depth approximately at a top surface of a top mirror of the degraded emitter, or a reduced via, etched through a dielectric passivation/mirror layer of the degraded emitter to expose a metal layer, the reduced via having a reduced size relative to other vias of the emitters in the first set of emitters.

16. The emitter array of claim 15, wherein each of the first set of emitters has a nominal optical output power at an operating voltage of the emitter array; and wherein each of the second set of emitters has substantially less than the nominal optical output power or no optical output power at the operating voltage.

17. The emitter array of claim 15, wherein the active region of the at least one degraded emitter, and other active regions of the first set of emitters and the second set of emitters, comprise a quantum well.

18. The emitter array of claim 15, wherein the central current blocking implant includes a proton implant.

19. The emitter array of claim 15, wherein active regions of the first set of emitters and the second set of emitters are positioned between an oxidation layer and a bottom mirror.

20. The emitter array of claim 15, wherein the first set of emitters and the second set of emitters are electrically connected in parallel.

\* \* \* \* \*